US012740234B2

(12) United States Patent
Yang et al.

(10) Patent No.: US 12,740,234 B2
(45) Date of Patent: Sep. 15, 2026

(54) OPTICAL MEMBER AND DISPLAY APPARATUS COMPRISING THE SAME

(71) Applicant: LG Display Co., Ltd., Seoul (KR)

(72) Inventors: SeungSoo Yang, Paju-si (KR); ChangHee Choi, Paju-si (KR); Yujin Kang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 465 days.

(21) Appl. No.: 18/458,934

(22) Filed: Aug. 30, 2023

(65) Prior Publication Data

US 2024/0215306 A1 Jun. 27, 2024

(30) Foreign Application Priority Data

Dec. 27, 2022 (KR) ........................ 10-2022-0185339

(51) Int. Cl.

*H10K 59/38* (2023.01)
*H10K 59/12* (2023.01)
*H10K 59/80* (2023.01)
*H10K 102/00* (2023.01)

(52) U.S. Cl.

CPC ......... *H10K 59/1201* (2023.02); *H10K 59/38* (2023.02); *H10K 59/8791* (2023.02); *H10K 2102/302* (2023.02)

(58) Field of Classification Search

CPC ........................... H10K 59/38; H10K 59/8791
USPC .................................................. 313/498–512
See application file for complete search history.

(56) References Cited

U.S. PATENT DOCUMENTS

2022/0085335 A1* 3/2022 Shimatsu ............... H10K 59/38
2025/0160118 A1* 5/2025 Shimatsu ............... H10K 59/38

FOREIGN PATENT DOCUMENTS

JP 2013228656 A * 11/2013

* cited by examiner

*Primary Examiner* — Christopher M Raabe
(74) *Attorney, Agent, or Firm* — Seed Intellectual Property Law Group LLP

(57) ABSTRACT

An optical member capable of improving a vision recognition rate of a mark used for alignment such as bonding alignment, and a display apparatus comprising the same are provided. The optical member comprises a first layer including a pattern portion having a plurality of concave portions and a plurality of convex portions between the plurality of concave portions, and a second layer covering the pattern portion. The second layer includes a central area and an outer area, and a refractive index of the second layer in the central area is different from that of the second layer in the outer area.

22 Claims, 13 Drawing Sheets

OPTICAL MEMBER AND DISPLAY APPARATUS COMPRISING THE SAME

CROSS-REFERENCE TO RELATED APPLICATIONS

This application claims the benefit of the Korean Patent Application No. 10-2022-0185339 filed on Dec. 27, 2022, which is hereby incorporated by reference as if fully set forth herein.

BACKGROUND

Technical Field

The present disclosure relates to an optical member for displaying an image and a display apparatus comprising the same.

Description of the Related Art

Among display apparatuses, an organic light emitting display apparatus has a high response speed, low power consumption and self-emits light without requiring a separate light source unlike a liquid crystal display apparatus, there is no problem in a viewing angle and thus the organic light emitting display apparatus has received attention as a next-generation flat panel display apparatus.

The organic light emitting display apparatus displays an image through light emission of a light emitting element layer that includes a light emitting layer interposed between two electrodes. The organic light emitting display apparatus may be fabricated by bonding of a lower substrate and an upper substrate, in which a light emitting element layer is provided.

BRIEF SUMMARY

Various embodiments of the present disclosure provide the technical benefits of increasing light extraction efficiency and reducing reflectance due to external light in an organic light emitting display apparatus. Various embodiments of the present disclosure also address an alignment defect during bonding of a lower substrate and an upper substrate.

The present disclosure has been made in view of the various technical problems in the related art and the various embodiments of the present disclosure provide an optical member capable of improving a vision recognition rate of a mark used for alignment such as bonding alignment, and a display apparatus comprising the same.

Various embodiments of the present disclosure provide an optical member capable of reducing an alignment defect of a lower substrate and an upper substrate and a display apparatus comprising the same.

Various embodiments of the present disclosure provide an optical member capable of reducing reflectance of external light and a display apparatus comprising the same.

Various embodiments of the present disclosure provide an optical member capable of improving light extraction efficiency of light emitted from a light emitting element layer and a display apparatus comprising the same.

Various embodiments of the present disclosure provide a display apparatus capable of reducing power consumption through light extraction.

Various embodiments of the present disclosure provide an optical member that may minimize or reduce occurrence of a radial rainbow pattern and a radial circular ring pattern, which is caused by reflection of external light, based on non-regularity or randomness of a diffraction pattern of reflective light generated by destructive interference and/or constructive interference of light and a display apparatus comprising the same.

Various embodiments of the present disclosure provide an optical member capable of reducing degradation of black visibility characteristics, which is caused by reflection of external light, and a display apparatus comprising the same.

Various embodiments of the present disclosure as mentioned above, additional objects and features of the present disclosure will be clearly understood by those skilled in the art from the following description of the present disclosure.

In accordance with an aspect of the present disclosure, the above and other objects can be accomplished by the provision of an optical member comprising a first layer including a pattern portion having a plurality of concave portions and a plurality of convex portions between the plurality of concave portions, and a second layer covering the pattern portion, wherein the second layer includes a central area and an outer area, and a refractive index of the second layer in the central area is different from that of the second layer in the outer area.

In accordance with another aspect of the present disclosure, the above and other objects can be accomplished by the provision of a display apparatus comprising a display panel for displaying an image, and an optical panel coupled to the display panel, wherein the optical panel includes an optical member, and the optical member includes a first layer including a pattern portion having a plurality of concave portions and a plurality of convex portions between the plurality of concave portions, and a second layer covering the pattern portion, wherein the second layer includes a central area and an outer area, and a refractive index of the second layer in the central area is different from that of the second layer in the outer area.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1:
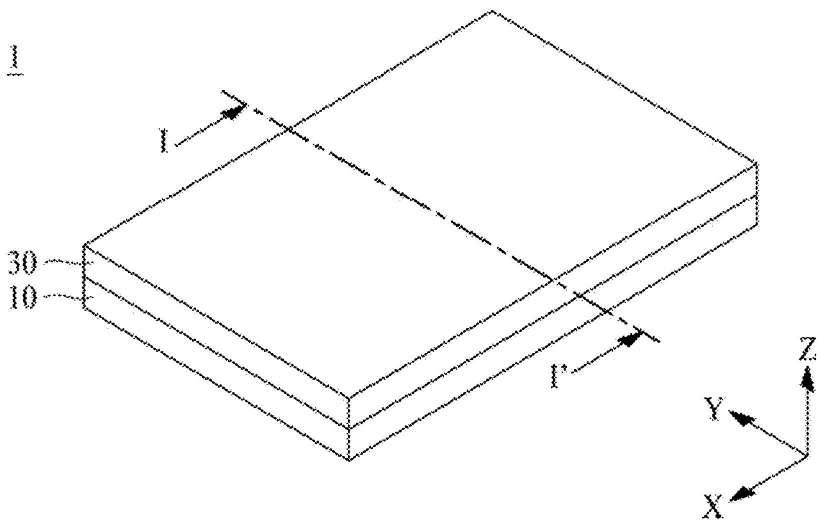
FIG. 1 is a schematic perspective view illustrating a display apparatus according to one embodiment of the present disclosure.

Reference will now be made in detail to the embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings.

The present disclosure may, however, be embodied in different forms and should not be construed as limited to the embodiments set forth herein.

Rather, these embodiments are provided so that this disclosure will be thorough and complete, and will fully convey the scope of the present disclosure to those skilled in the art.

A shape, a size, a dimension (e.g., length, width, height, thickness, radius, diameter, area, etc.), a ratio, an angle, and a number of elements disclosed in the drawings for describing embodiments of the present disclosure are merely an example, and thus, the present disclosure is not limited to the illustrated details.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Like reference numerals refer to like elements throughout. In the following description, when the detailed description of the relevant known function or configuration is determined to unnecessarily obscure the important point of the present disclosure, the detailed description will be omitted.

In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~,' 'over~,' 'under~,' and 'next~,' one or more other parts may be disposed between the two parts unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms.

These terms are only used to distinguish one element from another. For example, a first element could be termed a second element, and, similarly, a second element could be termed a first element, without departing from the scope of the present disclosure.

"X-axis direction," "Y-axis direction" and "Z-axis direction" should not be construed by a geometric relation only of a mutual vertical relation and may have broader directionality within the range that elements of the present disclosure may act functionally.

The term "at least one" should be understood as including any and all combinations of one or more of the associated listed items. For example, the meaning of "at least one of a first item, a second item and a third item" denotes the combination of all items proposed from two or more of the first item, the second item and the third item as well as the first item, the second item or the third item.

Features of various embodiments of the present disclosure may be partially or overall coupled to or combined with each other and may be variously inter-operated with each other and driven technically as those skilled in the art can sufficiently understand.

The embodiments of the present disclosure may be carried out independently from each other or may be carried out together in co-dependent relationship.

Hereinafter, the preferred embodiments of the present disclosure will be described in detail with reference to the accompanying drawings.

Figure 2:
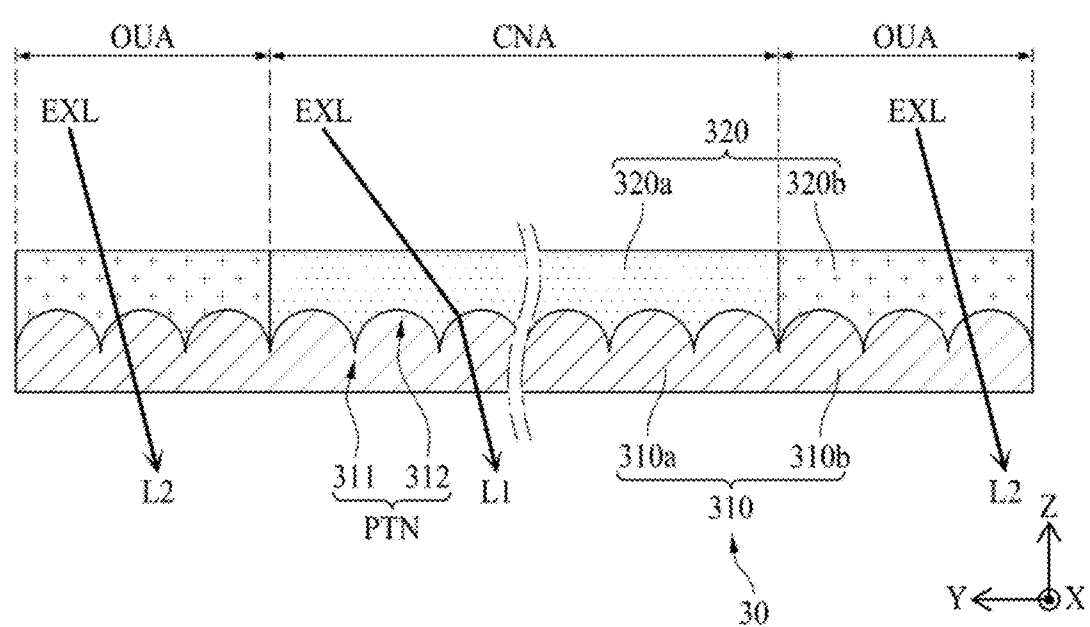
FIG. 2 is a schematic cross-sectional view taken along line I-I' shown in FIG. 1, illustrating an optical member of a display apparatus according to one embodiment of the present disclosure.
Figure 3:
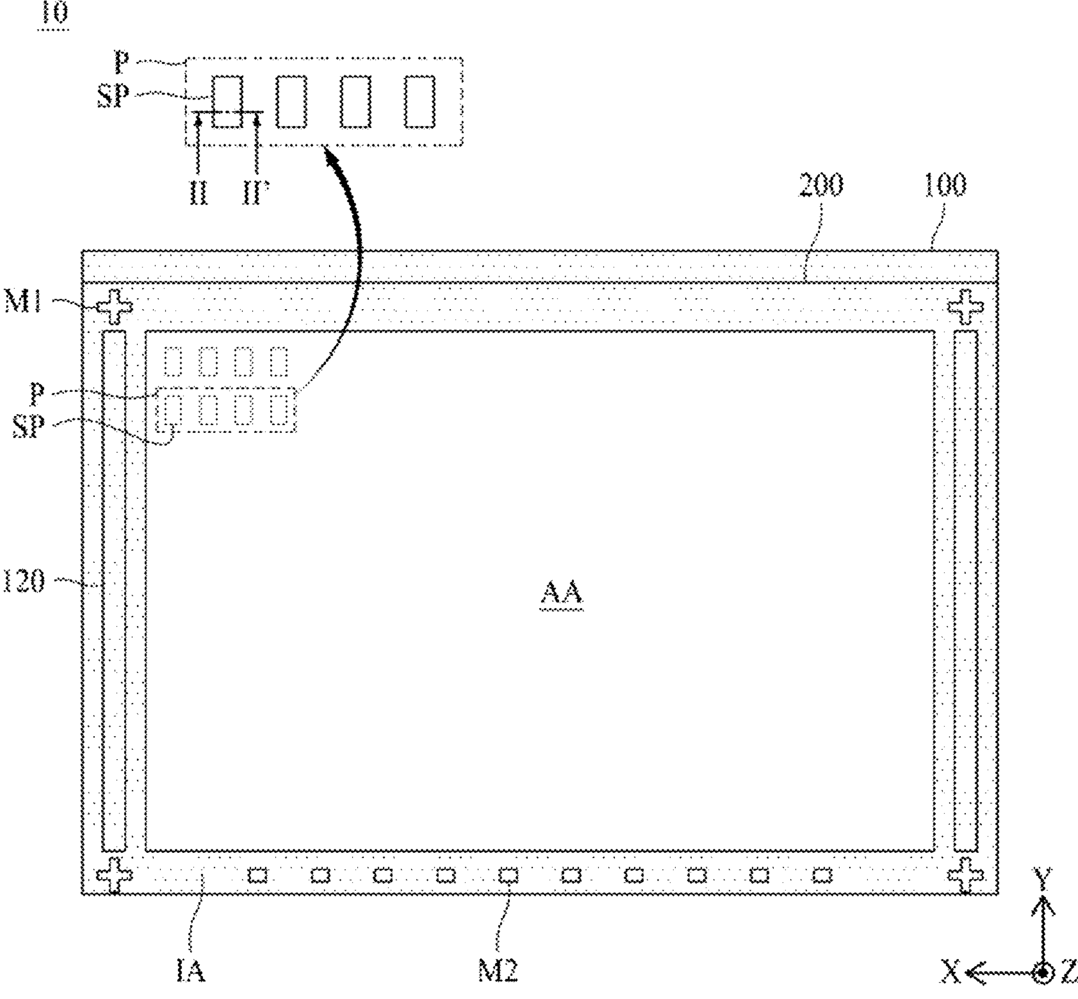
FIG. 3 is a schematic plan view illustrating a display panel included in a display apparatus according to one embodiment of the present disclosure.
Figure 4:
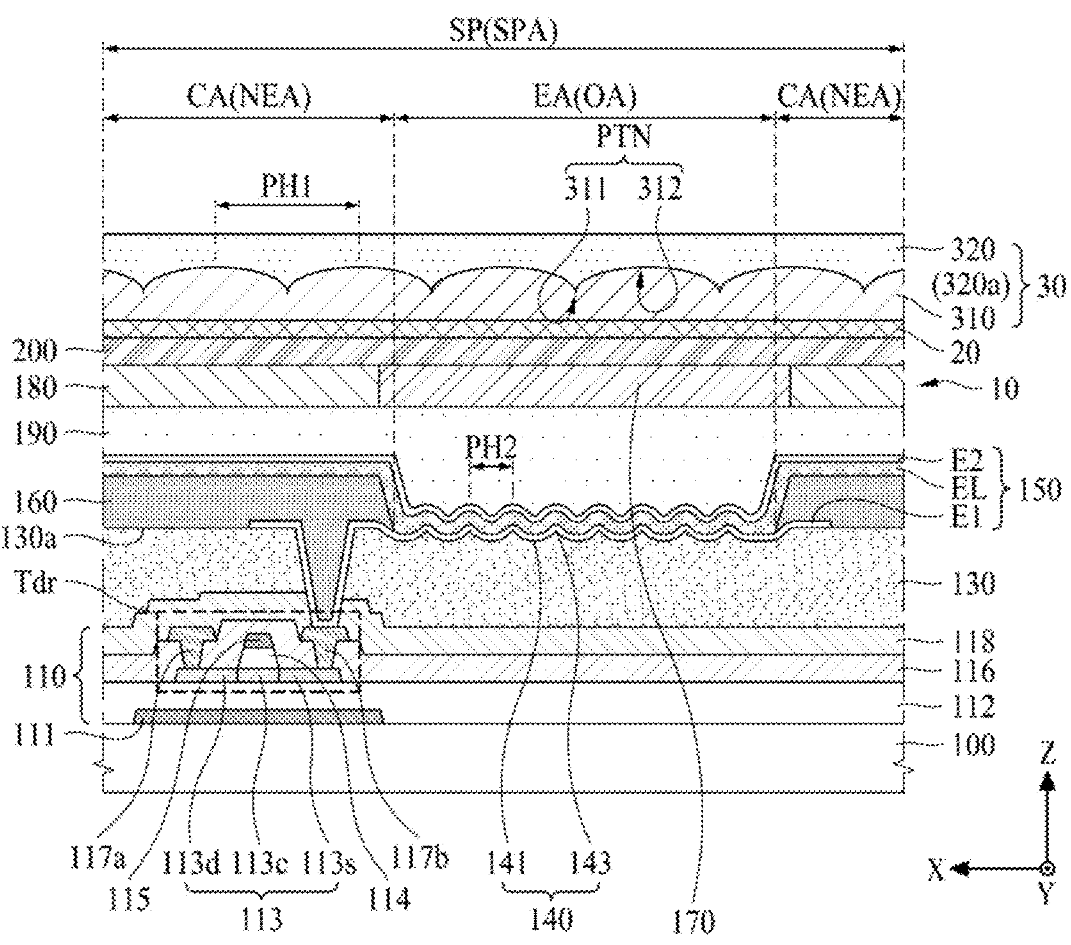
FIG. 4 is a schematic cross-sectional view taken along line II-II' shown in FIG. 3, illustrating a display apparatus according to one embodiment of the present disclosure.
Figure 5:
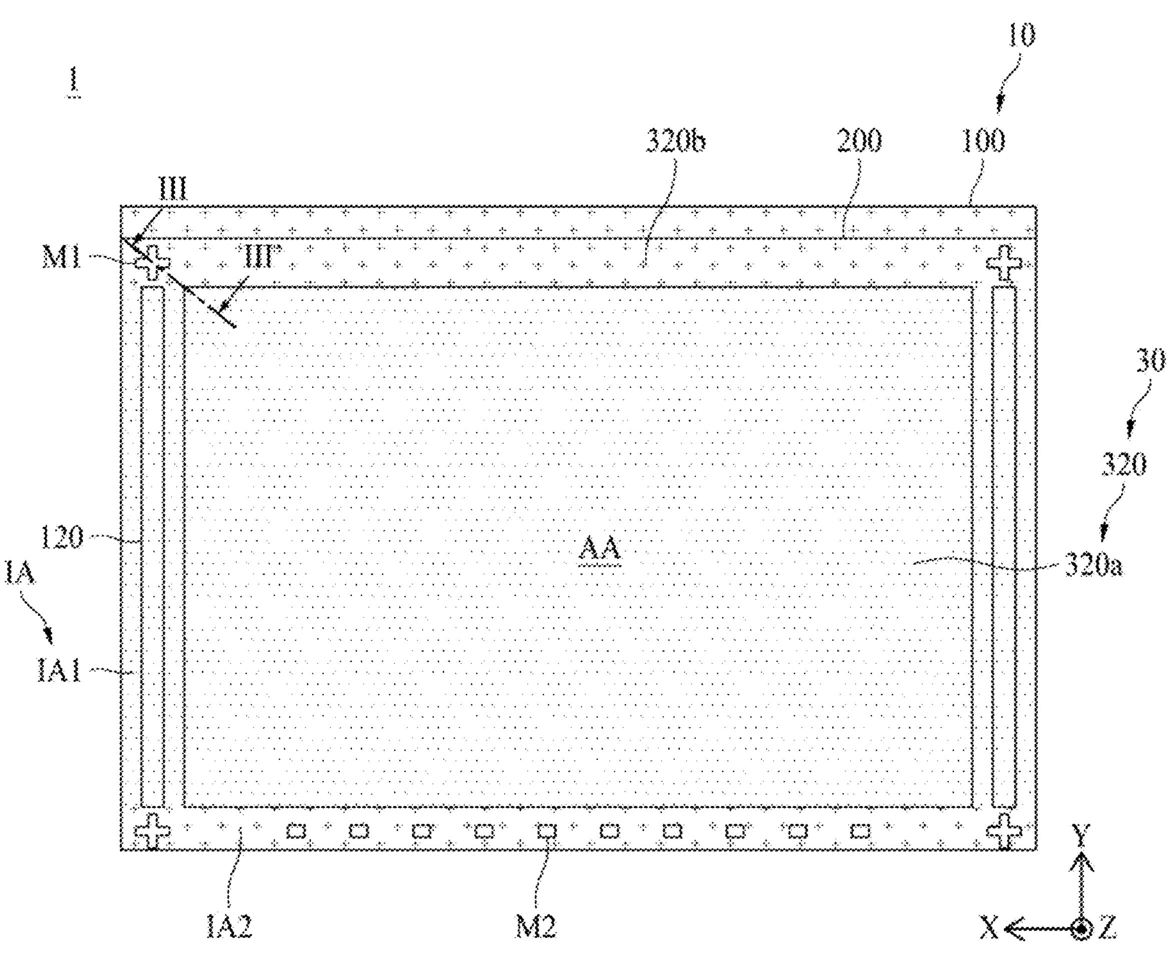
FIG. 5 is a schematic plan view illustrating a display apparatus according to one embodiment of the present disclosure.

FIG. 1 is a schematic perspective view illustrating a display apparatus according to one embodiment of the present disclosure, FIG. 2 is a schematic cross-sectional view taken along line I-I' shown in FIG. 1, illustrating an optical member of a display apparatus according to one embodiment of the present disclosure, FIG. 3 is a schematic plan view illustrating a display panel included in a display apparatus according to one embodiment of the present disclosure, FIG. 4 is a schematic cross-sectional view taken along line II-II' shown in FIG. 3, illustrating a display apparatus according to one embodiment of the present disclosure, and FIG. 5 is a schematic plan view illustrating a display apparatus according to one embodiment of the present disclosure.

Referring to FIGS. 1 to 5, an optical member 30 according to one embodiment of the present disclosure may include a first layer 310, which includes a pattern portion PTN having a plurality of concave portions 311 and a plurality of convex portions 312, and a second layer 320 covering the pattern portion PTN. The second layer 320 may include a central area CNA and an outer area OUA adjacent to the central area CNA. The outer area OUA according to one embodiment may be a predetermined area that includes an edge side based on FIG. 1. Therefore, the outer area OUA may be expressed as an edge area or an outside area. The central area CNA according to one embodiment of the present disclosure may be an area that is adjacent to the outer area OUA and is formed inside the outer area OUA. Therefore, the central area CNA may be expressed as an inner area.

In this case, a refractive index of the second layer 320 in the central area CNA may be different from that of the second layer 320 in the outer area OUA. For convenience of description, as shown in FIG. 2, the second layer 320 in the central area CNA is represented as 320*a*, and the second layer 320 in the outer area OUA is represented as 320*b*. Since the second layer 320*a* in the central area CNA has a refractive index different from that of the second layer 320*b* in the outer area OUA, the second layer 320*a* and the second layer 320*b* may be expressed by their respective hatchings different from each other as shown in FIG. 2.

Referring back to FIG. 2, the refractive index of the second layer 320*a* in the central area CNA may be different from that of the second layer 320*b* in the outer area OUA based on a second direction (Y-axis direction). For example, the refractive index of the second layer 320*a* in the central area CNA may be greater than that of the second layer 320*b* in the outer area OUA. Therefore, in the optical member 30 according to one embodiment of the present disclosure, a light path of external light EXL passing through the central area CNA and a light path of external light EXL passing through the outer area OUA may be different from each other.

The first layer 310 may be disposed below the second layer 320 to correspond to each of the central area CNA and the outer area OUA of the second layer 320. The refractive index of the first layer 310 according to one embodiment may be equally provided in the central area CNA and the outer area OUA. In detail, the first layer 310*a* in the central area CNA and the first layer 310*b* in the outer area OUA may have the same refractive index. The first layer 310 according to one embodiment may be provided to have a refractive index equal to or smaller than that of the second layer 320*b* in the outer area OUA.

For example, when the refractive index of the first layer 310 is equal to that of the second layer 320*b* in the outer area OUA, the refractive index of the first layer 310 and the refractive index of the second layer 320*a* may be different from each other in the central area CNA. In this case, as shown in FIG. 2, the external light EXL passing through the central area CNA may be refracted on a boundary surface between the first layer 310 and the second layer 320. The external light EXL passing through the outer area OUA may not be refracted on the boundary because there is no difference in the refractive index between the first layer 310 and the second layer 320.

When light is refracted, image distortion is generated so that a mark or an object cannot be accurately identified. That is, when light is refracted, it may be difficult to make sure of a recognition rate of the mark or the object. In contrast, when light is not refracted, distortion is not generated in the image, so that a recognition rate may be improved, whereby the mark or the object may be accurately identified. Although the external light EXL is described as passing through the optical member with reference to FIG. 2, this may be described as a recognition rate of the naked eye of a person or a vision device such as a camera.

Although refractive characteristics of light due to the difference in the refractive index between the first layer 310 and the second layer 320 have been described as an example with reference to FIG. 2, the optical member 30 according to one embodiment of the present disclosure is provided to include a plurality of concave portions 311 and a plurality of convex portions 312, so that external light passing through each of the plurality of concave portions 311 and the plurality of convex portions 312 may be diffracted and/or scattered, whereby the intensity of light may be reduced. Therefore, in the optical member 30 according to one embodiment of the present disclosure, the difference in the refractive index between the first layer 310 and the second layer 320 is differently provided in the central area CNA and the outer area OUA, and the first layer 310 includes a plurality of concave portions 311 and a plurality of convex portions 312, so that light may be diffracted and/or scattered in the central area CNA to reduce the intensity of external light EXL, and light may not be refracted in the outer area OUA to improve a recognition rate of the mark or the object.

The display apparatus 1 according to one embodiment of the present disclosure may include a display panel 10 for displaying an image and an optical panel LP (shown in FIG. 6) coupled to the display panel 10. The optical panel LP may include the optical member 30. The optical panel LP according to one example may further include a polarizing plate 40. The optical panel LP may be coupled to an upper side of the display panel 10 or a lower side of the display panel 10. In FIG. 1, for convenience of description, a display panel 10 and an optical member 30 coupled to an upper surface of the display panel 10 are illustrated.

The display panel 10 according to one embodiment may include a display area AA having a plurality of subpixels SP and a non-display area IA adjacent to the display area AA. The plurality of subpixels SP may be included in one pixel P. For example, one pixel P may include a red subpixel, a green subpixel, a blue subpixel and a white subpixel. As shown in FIG. 3, the non-display area IA according to one embodiment may be disposed along an edge of the display area AA. The non-display area IA may be expressed as being disposed to surround the display area AA.

The display area AA according to one embodiment may be disposed to correspond to the central area CNA of the optical member 30. The non-display area IA according to one embodiment may be disposed to correspond to the outer area OUA of the optical member 30. The non-display area IA may include a plurality of alignment marks M1 (shown in FIG. 5) for bonding the substrate 100 (shown in FIG. 4) included in the display panel 10 to the opposing substrate 200 (shown in FIG. 4). In addition, the non-display area IA may further include a plurality of tab bonding marks M2 (shown in FIG. 5) for bonding a printed circuit board (PCB) for driving the pixel P of the display area AA to the substrate 100.

For example, the non-display area IA may include a first non-display area IA1 having a peripheral circuit portion 120 connected to the plurality of subpixels SP and a second non-display area IA2 adjacent to the first non-display area IA1. For example, as shown in FIG. 5, the first non-display area IA1 may be provided in each of left and right sides of the display area AA in a first direction (X-axis direction). The second non-display area IA2 may be provided on upper and lowers sides of the display area AA in the second direction (Y-axis direction). The first direction (X-axis direction) may be a horizontal direction (or long side direction) of the display apparatus 1 based on FIG. 5. The second direction (Y-axis direction) is a direction perpendicular to the first direction (X-axis direction), and may be a vertical direction (or short side direction) of the display apparatus 1 based on FIG. 5. A third direction (Z-axis direction) is a direction perpendicular to each of the first direction (X-axis direction) and the second direction (Y-axis direction), and may be a thickness direction of the display apparatus 1.

The plurality of alignment marks M1 according to one example may be disposed in the second non-display area IA2. The plurality of tab bonding marks M2 according to one example may be disposed in the second non-display area IA2. However, the present disclosure is not limited to the above examples. When a vision recognition rate for the plurality of alignment marks M1 and/or the plurality of tab bonding marks M2 is high, the plurality of alignment marks M1 and the plurality of tab bonding marks M2 may be disposed in the first non-display area IA1.

As described above, in the optical member 30 according to one embodiment of the present disclosure, since light may be diffracted or scattered by the first layer 310 and the second layer 320, which are provided in the central area CNA, the intensity of external light EXL incident on the display area AA may be reduced. Therefore, the display apparatus 1 according to one embodiment of the present disclosure may reduce reflectance of the external light in the central area CNA.

Also, in the display apparatus 1 according to the present disclosure, since the optical member 30 is provided on the display panel 10 having a light extraction portion 140, the intensity of external light incident on the light extraction portion 140 may be reduced by the optical member 30, a diffraction pattern of reflective light generated in the light extraction portion 140 may be suppressed or minimized, or occurrence of a radial rainbow pattern and a radial circular ring pattern of the reflective light may be suppressed or minimized due to non-regularity or randomness of the diffraction pattern of the reflective light.

Also, in the display apparatus 1 according to the present disclosure, since the external light may be subdivided by diffraction by the optical member 30, occurrence of the radial rainbow pattern and the radial circular ring pattern due to the external light may be suppressed or minimized, whereby real black visibility in a non-driving or off state may be implemented.

In addition, since the optical member 30 according to one embodiment of the present disclosure does not refract light in the outer area OUA, the recognition rate (or vision recognition rate) of the alignment mark M1 and/or the tab bonding mark M2 in the non-display area IA of the display panel 10 may be improved. Therefore, the display apparatus 1 according to one embodiment of the present disclosure includes the optical member 30 having the improved vision recognition rate in the outer area OUA, whereby an alignment defect of the substrate 100 (or lower substrate) and the opposing substrate 200 (or upper substrate) may be reduced. Also, the display apparatus 1 according to one embodiment of the present disclosure includes the optical member 30 having the improved vision recognition rate of the outer area OUA, so that the printed circuit board (PCB) may be accurately adhered to the tab, whereby a driving defect for outputting an image may be reduced.

Hereinafter, the display apparatus 1 according to one embodiment of the present disclosure will be described in detail with reference to FIGS. 3 and 4.

The display panel 10 may include a substrate 100 and an opposing substrate 200, which are bonded to each other.

The substrate 100 may include a first substrate, a lower substrate, a transparent glass substrate or a transparent plastic substrate. The substrate 100 may include a display area AA and a non-display area IA.

The display area AA is an area where an image is displayed, and may be a pixel array area, an active area, a pixel array unit, a display unit, or a screen. For example, the display area AA may be disposed at a central portion of the display panel 10. The display area AA may include a plurality of pixels P.

A plurality of pixels P may be defined as unit areas in which light is actually emitted. Each of the plurality of pixels P may include a plurality of subpixels SP. According to one embodiment, each of the plurality of pixels P may include at least one red subpixel, at least one green subpixel, at least one blue subpixel, and at least one white subpixel, but is not limited thereto. For example, each of the plurality of pixels P may include a red subpixel, a green subpixel, a blue subpixel, and a white subpixel. Sizes of the plurality of subpixels included in each of the plurality of pixels P may be the same as or different from each other.

The non-display area IA is an area on which an image is not displayed, and may be a peripheral area, a signal supply area, an inactive area or a bezel area. The non-display area IA may be configured to be in the vicinity of the display area AA. The display panel 10 or the substrate 100 may further include a peripheral circuit portion 120 disposed in a non-display area IA.

The peripheral circuit portion 120 may include a gate driving circuit connected to the plurality of pixels P. The gate driving circuit may be integrated in the non-display area IA at one side or both sides of the substrate 100 in accordance with a manufacturing process of the thin film transistor, and may be connected to the plurality of pixels P. For example, as shown in FIG. 5, the peripheral circuit portion 120 may be formed in the non-display area IA on both sides of the display area AA. The gate driving circuit according to one example may include a known shift register.

The opposite substrate 200 may encapsulate (or seal) the display area AA disposed on the substrate 100. For example, the opposite substrate 200 may be bonded to the substrate 100 via an adhesive member (or clear glue). The opposite substrate 200 may be an upper substrate, a second substrate, or an encapsulation substrate.

An optical panel LP (shown in FIG. 6) may be coupled to the display panel 10 of the display apparatus 1 according to one embodiment of the present disclosure to reduce the intensity of external light incident on the display panel 10. According to one embodiment of the present disclosure, the optical panel LP includes an optical member 30, and may be coupled to the upper side of the display panel 10 or the lower side of the display panel 10. The optical panel LP will be described later with reference to FIG. 6.

FIG. 4 is a cross-sectional view illustrating one subpixel shown in FIG. 3 and a case that an optical member 30 is coupled onto the subpixel. Although FIG. 3 shows the display panel 10 of the display apparatus 1, when the optical member 30 is disposed on the display panel 10, the cross-section taken along line II-II' shown in FIG. 3 may be provided as shown in FIG. 4.

Referring to FIGS. 3 and 4, the display panel 10 according to one embodiment of the present disclosure may include a plurality of subpixels SP.

Each of the plurality of subpixels SP may be disposed in each of a plurality of subpixel areas SPA disposed in the pixel P (or pixel area). The subpixel area SPA according to one embodiment may include a circuit area CA and a light emission area EA. The circuit area CA may be spatially separated from the light emission area EA in the subpixel area SPA, but is not limited thereto. For example, at least a portion of the circuit area CA may overlap the light emission area EA in the subpixel area SPA or may be disposed below the light emission area EA. The light emission area EA may be an opening area OA, a light emitting area, a transmissive area, or a transmissive portion. For example, the circuit area CA may be a non-light emission area NEA or a non-opening area. The subpixel area SPA according to another embodiment may further include a transparent portion disposed near at least one of the light emission area EA or the circuit area CA. For example, one pixel may include a light emission area for each pixel corresponding to each of the plurality of subpixels SP and a transparent portion disposed near each of the plurality of subpixels SP. In this case, the light emitting display apparatus may realize a transparent light emitting display apparatus due to light transmission of the transparent portion.

The display panel 10 according to one embodiment of the present disclosure may include a pixel circuit layer 110, an overcoat layer 130 and a light emitting element layer 150, which are disposed on the substrate 100.

The pixel circuit layer 110 may include a buffer layer 112, a pixel circuit, and a passivation layer 118.

The buffer layer 112 may be disposed on an entire first surface (or upper surface) of the substrate 100. The buffer layer 112 may serve to prevent materials contained in the substrate 100 from being diffused into a transistor layer or prevent external water or moisture from being permeated into the light emitting element layer 150 during a high temperature process of a manufacturing process of the thin film transistor. For example, the buffer layer 112 may be a first insulating layer, a first inorganic material layer or a lowermost insulating layer among a plurality of insulating layers disposed on the pixel circuit layer of the substrate 100.

The pixel circuit may include a driving thin film transistor Tdr disposed in the circuit area CA of each subpixel SP (or subpixel area SPA). The driving thin film transistor Tdr may include an active layer 113, a gate insulating layer 114, a gate electrode 115, an interlayer insulating layer 116, a drain electrode 117*a*, and a source electrode 117*b*.

The active layer 113 may be formed of a semiconductor material based on any one of amorphous silicon, polycrystalline silicon, oxide and organic material.

The gate insulating layer 114 may be formed on the channel area of the active layer 113. As an example, the gate insulating layer 114 may be formed in an island shape only on the channel area of the active layer 113, or may be formed on an entire front surface of the substrate 100 or the buffer layer 112, which includes the active layer 113. For example, when the gate insulating layer 114 is formed on the entire surface of the buffer layer 112, the gate insulating layer 114 may be a second insulating layer, a second inorganic material layer or a lowermost intermediate insulating layer among a plurality of insulating layers disposed on the pixel circuit layer of the substrate 100.

The gate electrode 115 may be disposed on the gate insulating layer 114 to overlap a channel area 113*c* of the active layer 113.

The interlayer insulating layer 116 may be formed on the gate electrode 115 and the drain area 113*d* and the source area 113*s* of the active layer 113. The interlayer insulating layer 116 may be formed on the substrate 100 or an entire surface of the buffer layer 112. For example, the interlayer insulating layer 116 may be a third insulating layer, a third inorganic material layer, or an upper insulating layer among a plurality of insulating layers disposed on the substrate 100.

The drain electrode 117*a* may be disposed on the interlayer insulating layer 116 so as to be electrically connected to a drain area 113*d* of the active layer 113. The source electrode 117*b* may be disposed on the interlayer insulating layer 116 so as to be electrically connected to a source area 113*s* of the active layer 113.

The pixel circuit may further include first and second switching thin film transistors and at least one capacitor, which are disposed in the circuit area CA together with the driving thin film transistor Tdr. The display panel according to the present disclosure may further include a light shielding layer 111 provided below the active layer 113 of at least one of the driving thin film transistor Tdr, the first switching thin film transistor or the second switching thin film transistor. The light shielding layer 111 may be configured to minimize or prevent a change in a threshold voltage of the thin film transistor due to external light.

The passivation layer 118 may be disposed over the substrate 100 to cover the pixel circuit. For example, the passivation layer 118 may be configured to cover the drain electrode 117*a*, the source electrode 117*b*, and the interlayer insulating layer 116 of the driving thin film transistor Tdr. For example, the passivation layer 118 may be made of an inorganic insulating material. For example, the passivation layer 118 may be a fourth insulating layer, a fourth inorganic material layer or an uppermost intermediate insulating layer among a plurality of insulating layers disposed on the pixel circuit layer of the substrate 100.

The overcoat layer 130 may be provided on the substrate 100 to cover the pixel circuit layer 110. The overcoat layer 130 may be formed in the other area except a pad area of the non-display area and the entire display area. For example, the overcoat layer 130 may include an extension portion (or an enlarged portion) extended or enlarged from the display area to the other non-display area except the pad area. Therefore, the overcoat layer 130 may have a size relatively wider than that of the display area.

The overcoat layer 130 according to one example may be formed to have a relatively thick thickness, thereby providing a flat surface on the pixel circuit layer 110. For example, the overcoat layer 113 may be made of an organic material such as photo acryl, benzocyclobutene, polyimide and fluorine resin. For example, the overcoat layer 130 may be a fifth insulating layer, an organic material layer, an uppermost insulating layer or a planarization layer among a plurality of insulating layers disposed on the substrate 100.

The overcoat layer 130 may include a light extraction portion 140 disposed in each subpixel SP. The light extraction portion 140 may be formed on an upper surface 130*a* of the overcoat layer 130 to overlap the light emission area EA of the subpixel area SPA. Therefore, the light extraction portion 140 may overlap at least one of the plurality of concave portions 311 or the plurality of convex portions 312, which are included in the optical member 30.

The light extraction portion 140 may be formed on the overcoat layer 130 of the light emission area EA to have a curved (or uneven) shape, thereby changing a propagation path of light emitted from the light emitting element layer 150 to increase light extraction efficiency. For example, the light extraction portion 140 may be a non-flat portion, an uneven pattern portion, a micro lens portion, or a light scattering pattern portion.

The light extraction portion 140 may include a plurality of concave patterns 141 and a convex pattern 143 disposed near each of the plurality of concave patterns 141. The plurality of concave patterns 141 may be concavely formed or configured from the upper surface 130*a* of the overcoat layer 130. The convex pattern 143 may be disposed between the plurality of concave patterns 141. The convex pattern 143 may be formed to surround each of the plurality of concave patterns 141.

An upper portion of the convex pattern 143 may have a convex curved shape to increase light extraction efficiency, but is not limited thereto. For example, the upper portion of the convex pattern 143 may include a pointed tip structure. For example, the upper portion of the convex pattern 143 may include a convex cross-sectional dome or bell structure, but is not limited thereto.

The convex pattern 143 may include an inclined portion having a curved shape between a bottom portion and an upper portion (or a top portion). The inclined portion of the convex pattern 143 may form or configure the concave pattern 141. For example, the inclined portion of the convex pattern 143 may be an inclined surface or a curved portion. The inclined portion of the convex pattern 143 according to one embodiment may have a cross-sectional structure of a Gaussian curve. In this case, the inclined portion of the convex pattern 143 may have a tangent slope that is gradually increased from the bottom portion to the upper portion and gradually reduced.

The light emitting element layer 150 may be disposed on the light extraction portion 140 that overlaps the light emission area EA. The light emitting element layer 150 may be configured to emit light toward an opposing substrate 200 in accordance with a top emission type, but the embodiment of the present disclosure is not limited thereto. The light emitting element layer 150 according to one embodiment may include a first electrode E1, a light emitting layer EL and a second electrode E2.

The first electrode E1 may be formed on the overcoat layer 130 of the subpixel area SPA and electrically connected to the source electrode 117*b* (or the drain electrode 117*a*) of the driving thin film transistor Tdr. One end of the first electrode E1 adjacent to the circuit area CA may be electrically connected to the source electrode 117*b* (or the drain electrode 117*a*) of the driving thin film transistor Tdr through an electrode contact hole provided in the overcoat layer 130 and the passivation layer 118.

Since the first electrode E1 is directly in contact with the light extraction portion 140, the first electrode E1 has a shape that follows a shape of the light extraction portion 140. Since the first electrode E1 is formed (or deposited) on the overcoat layer 130 to have a relatively thin thickness, the first electrode E1 has a surface shape that conforms to a surface morphology of the light extraction portion 140 that includes the plurality of convex patterns 143 and the plurality of concave portions 141. For example, the first electrode E1 may have the same cross-sectional structure as that of the light extraction portion 140 as the first electrode E1 is formed in a conformal shape, which follows the surface shape (or morphology) of the light extraction portion 140, by a deposition process of a transparent conductive material.

The light emitting layer EL may be formed on the first electrode E1 and thus may be directly in contact with the first electrode E1. The light emitting layer EL may be formed (or deposited) on the first electrode E1 so as to have a relatively thick thickness as compared with the first electrode E1, thereby having a surface shape different from that of each of the plurality of concave portions 141 and the plurality of convex patterns 143 or that of the first electrode E1. For example, the light emitting layer EL may be formed in a non-conformal shape, which does not follow the surface shape (or morphology) of the first electrode E1, by a deposition process and thus may have a cross-sectional structure different from that of the first electrode E1.

The light emitting layer EL according to one embodiment may have a thickness that is gradually increased toward the bottom surface of the concave pattern 141. For example, the light emitting layer EL may be formed on the top of the convex pattern 143 to have a first thickness, may be formed on the bottom surface of the concave pattern 141 to have a second thickness thicker than the first thickness, and may be formed on the inclined surface (or the curved portion) of the convex pattern 143 to have a third thickness thinner than the first thickness. Each of the first to third thicknesses may correspond to a shortest distance between the first electrode E1 and the second electrode E2. However, it is not limited thereto, and the thickness of the light emitting layer EL may vary according to the shapes of the plurality of concave patterns 141 and the plurality of convex patterns 143.

The light emitting layer EL according to one embodiment may include two or more organic light emitting layers for emitting white light. For example, the light emitting layer EL may include first and second organic light emitting layers for emitting white light by mixing first light with second light. For example, the first organic light emitting layer may include any one of a blue organic light emitting layer, a green organic light emitting layer, a red organic light emitting layer, a yellow organic light emitting layer and a yellow-green organic light emitting layer to emit the first light. For example, the second organic light emitting layer may include an organic light emitting layer for emitting the second light for implementing white light by mixture with the first light of the blue organic light emitting layer, the green organic light emitting layer, the red organic light emitting layer, the yellow organic light emitting layer and the yellow-green organic light emitting layer. The light emitting layer EL according to another embodiment may include any one of the blue organic light emitting layer, the green organic light emitting layer and the red organic light emitting layer. Additionally, the light emitting layer EL may include a charge generation layer interposed between the first organic light emitting layer and the second organic light emitting layer.

The second electrode E2 may be formed on the light emitting layer EL and thus may be directly in contact with the light emitting layer EL. The second electrode E2 may be formed (or deposited) on the light emitting layer EL to have a relatively thin thickness as compared with the light emitting layer EL. The second electrode E2 may be formed (or deposited) on the light emitting layer EL to have a relatively thin thickness, thereby having a surface shape that conforms to that of the light emitting layer EL. For example, the second electrode E2 may be formed in a conformal shape that conforms to the surface shape (or morphology) of the light emitting layer EL by a deposition process to have a cross-sectional structure the same as that of the light emitting layer EL and different from that of the light extraction portion 140.

The second electrode E2 according to one embodiment may include a metal material having low reflectance or a transflective metal to emit incident light, which is emitted from the light emitting layer EL, toward the opposing substrate 200, but is not limited thereto. When the display panel 10 of the present disclosure is implemented in a bottom emission type, the second electrode E2 may include a metal material having high reflectance to reflect light toward the substrate 100. For example, the second electrode E2 may include a single layered structure or multi-layered structure made of any one material selected from aluminum (Al), silver (Ag), molybdenum (Mo), gold (Au), magnesium (Mg), calcium (Ca) and barium (Ba), or two or more alloy materials. When the display panel 10 of the present specification is implemented in a bottom emission type, the second electrode E2 may include an opaque conductive material having high reflectivity. For example, the second electrode E2 may be a reflective electrode, a cathode electrode, a light-reflective surface, or a light-reflector, and in this case, the first electrode E1 may be an anode electrode or a transparent electrode.

The light emitting element layer 150 may emit light by a current supplied by the pixel circuit. The concave pattern 141 or the convex pattern 143 of the light extraction portion 140 increases external extraction efficiency of the light emitted from the light emitting layer EL by changing a path of the light emitted from the light emitting layer EL to the opposing substrate 200. For example, the convex pattern 143 prevents or minimizes degradation of light extraction efficiency due to light trapped in the light emitting element layer 150 by repeating total reflection between the first electrode E1 and the second electrode E2 of the light emitting element layer 150 without moving the light emitted from the light emitting element layer 150 to the opposing substrate 200. Therefore, the display apparatus 1 according to one embodiment of the present disclosure may improve light extraction efficiency of the light emitted from the light emitting element layer 150.

In the display apparatus 1 according to one embodiment of the present disclosure, since light extraction efficiency may be improved through the light extraction portion 140, the display apparatus 1 may have the same light emission efficiency or higher light emission efficiency even with low power as compared with the display apparatus having no light extraction portion, whereby overall power consumption may be reduced.

The display panel 10 according to one embodiment of the present disclosure may further include a bank layer 160. The bank layer 160 may be provided on an edge of the first electrode E1 and the overcoat layer 130. The bank layer 160 may be formed of an organic material such as a benzocyclobutene (BCB)-based resin, an acryl-based resin or a polyimide resin.

The bank layer 160 may be provided on the upper surface 130*a* of the overcoat layer 130 to cover the edge of the first electrode E1 extended onto the circuit area CA. The light emission area EA defined by the bank layer 160 may have a size smaller than that of the light extraction portion 140 of the overcoat layer 130 in a plan view.

The light emitting layer EL of the light emitting element layer 150 may be formed on the first electrode E1, the bank layer 160, and a step difference portion between the first electrode E1 and the bank layer 160. In this case, when the light emitting layer EL is formed in the step difference portion between the first electrode E1 and the bank layer 160 to have a relatively thin thickness, the second electrode E2 may be in electrical contact (or short) with the first electrode E1. To solve this problem, an end (or outermost bank line) of the bank layer 160 adjacent to the light emission area EA may be disposed to cover an edge portion of the light extraction portion 140. Therefore, an electrical contact (or short) between the first electrode E1 and the second electrode E2 may be prevented from occurring due to the light emitting layer EL disposed in the step difference portion between the first electrode E1 and the bank layer 160.

The display panel 10 according to the present disclosure may further include a color filter layer 170.

The color filter layer 170 is for color conversion of light emitted from the light emitting element layer 150. When the display apparatus of the present disclosure is implemented in a top emission type, the color filter layer 170 according to one embodiment may be disposed between the opposing substrate 200 and the light emitting element layer 150 to overlap at least one light emission area EA. When the display apparatus of the present disclosure is implemented in a bottom emission type, the color filter layer 170 according to another embodiment may be disposed between the passivation layer 118 and the overcoat layer 130 to overlap the light emission area EA. The color filter layer 170 according to another embodiment may be disposed between the interlayer insulating layer 116 and the passivation layer 118 or between the substrate 100 and the interlayer insulating layer 116 to overlap the light emission area EA.

When the display panel 10 according to the present disclosure is coupled to the optical member 30, the color filter layer 170 may be disposed between the light emitting element layer 150 and the optical member 30. Therefore, the color filter layer 170 may color-convert light emitted from the light emitting element layer 150 and directed toward the optical member 30.

The color filter layer 170 may have a size larger than that of the light emission area EA. For example, the color filter layer 170 may have a size larger than that of the light emission area EA and smaller than that of the light extraction portion 140 of the overcoat layer 130, but is not limited thereto. The color filter layer 170 may have a size larger than that of the light extraction portion 140. For example, when the color filter layer 170 has a size larger than that of the light extraction portion 140, light leakage, in which internal light moves toward the subpixel SP adjacent thereto, may be reduced or minimized.

The color filter layer 170 according to one embodiment may include a color filter that transmits only a wavelength of a color, which is set in the subpixel SP among light emitted (or extracted) from the light emitting element layer 150 to the opposing substrate 200. For example, the color filter layer 170 may transmit a red, green or blue wavelength. When one pixel P includes first to fourth subpixels SP adjacent to one another, a color filter layer provided in the first subpixel may include a red color filter, a color filter layer provided in the second subpixel may include a green color filter, and a color filter layer provided in the third subpixel may include a blue color filter. The fourth subpixel may not include a color filter layer, or may include a transparent material for compensation of a step difference, thereby emitting white light.

The display panel 10 according to one embodiment of the present disclosure may include a black matrix 180.

The black matrix 180 may be formed in the non-emission area NEA adjacent to the light emission area EA. The black matrix 180 according to one example may be formed on the bank layer 160 to be adjacent to the color filter layer 170. For example, the black matrix 180 may surround the light emission area EA. The black matrix 180 may prevent light emitted from the subpixel SP for emitting light from being emitted toward an adjacent subpixel SP. Therefore, color mixture may be prevented from occurring between the subpixel SP for emitting light and the adjacent subpixel SP.

The display panel 10 according to one embodiment of the present disclosure may include an encapsulation portion 190.

The encapsulation portion 190 may be formed on the substrate 100 to cover the light emitting element layer 150. The encapsulation portion 190 may be provided on the substrate 100 to cover the second electrode E2. For example, the encapsulation portion 190 may surround the display area. The encapsulation portion 190 may serve to protect the thin film transistor and the light emitting layer EL from external impact and prevent oxygen and/or moisture or particles from being permeated into the light emitting layer EL.

The encapsulation portion 190 according to one embodiment may include a plurality of inorganic encapsulation layers. The encapsulation portion 190 may further include at least one organic encapsulation layer interposed between the plurality of inorganic encapsulation layers. The organic encapsulation layer may be expressed as a particle cover layer.

The encapsulation portion 190 according to another embodiment may be changed to a filler fully surrounding the display area, and in this case, the opposing substrate 200 may be bonded to the substrate 100 via the filler. The filler may include a getter material that absorbs oxygen and/or moisture.

The opposing substrate 200 may be coupled to the encapsulation portion 190. The opposing substrate 200 may be made of a plastic material, a glass material, or a metal material. For example, when the encapsulation portion 190 includes a plurality of inorganic encapsulation layers, the opposing substrate 200 may be omitted.

Optionally, when the encapsulation portion 190 is changed to a filler, the opposing substrate 200 may be coupled to the filler, and in this case, the opposing substrate 200 may be made of a plastic material, a glass material, or a metal material.

The optical member 30 may be coupled onto the opposing substrate 200. The optical member 30 may be coupled to the opposing substrate 200 through an adhesive 20. The adhesive 20 may be made of a transparent adhesive material having high light transmittance to enhance visibility of light emitted from the light emitting element layer 150. For example, the adhesive 20 may include at least one of PSA or OCA.

Referring to FIG. 4, a lower surface of the first layer 310 may be formed to be flat. Therefore, the optical member 30 according to one embodiment of the present disclosure may be easily coupled to the display panel 10 through the adhesive 20 such as OCA and PSA. Similarly, as an upper surface of the second layer 320 is formed to be flat, the optical member 30 according to one embodiment of the present disclosure may be easily coupled to the polarizing plate through the adhesive 20 such as OCA and PSA. That is, in the optical member 30 according to one embodiment of the present disclosure, at least one surface of each of the first layer 310 and/or the second layer 320 is provided as a flat surface without bending of the pattern portion PTN, so that the optical member 30 may be easily integrated with other optical components such as a polarizing plate.

Meanwhile, the opposing substrate 200 may be aligned with the substrate 100 by marking an alignment mark M1, which is provided in the non-display area IA, thereby being bonded to the substrate 100. In detail, after the thin film transistor, the insulating layer and the light emitting element layer 150, which are described above, are formed on the substrate 100, and a color filter layer 170 and a black matrix 180 are formed on the opposing substrate 200, the substrate 100 and the opposing substrate 200 may be aligned and bonded to each other through the alignment mark M1.

However, in this case, in order to reduce the intensity of external light, when an optical member provided with a first layer and a second layer, which have a great difference in the refractive index, is disposed on the opposing substrate, a recognition rate of the alignment mark may be lowered to cause the alignment defect. In order to solve such a problem, the display apparatus 1 according to one embodiment of the present disclosure may be provided so that the difference in the refractive index between the first layer 310 and the second layer 320, which are disposed in the outer area OUA, may be smaller than that in the refractive index between the first layer 310 and the second layer 320, which are disposed in the central area CNA. Therefore, light may be diffracted or scattered in the central area CNA to reduce the intensity of the external light EXL, and the light may not be refracted in the outer area OUA to improve the recognition rate of the alignment mark M1, whereby assembly may be improved, which results in decrease in a defect rate.

Referring back to FIG. 4, in the display apparatus 1 according to the first embodiment of the present disclosure, one convex portion 312 among the plurality of convex portions 312 may overlap several convex patterns 143 of a plurality of convex patterns 143. For example, the display apparatus 1 according to one embodiment of the present disclosure may be provided so that a pitch PH2 of the plurality of convex patterns 143 is smaller than a pitch PH1 of the plurality of convex portions 312. Therefore, the number of the light extraction portions 140 (or a plurality of concave patterns 141 and the plurality of convex patterns 143) may be greater than the number of the pattern portions PTN (or the plurality of concave portions 311 and the plurality of convex portions 312) based on the light emission area EA. Therefore, in the display apparatus 1 according to FIG. 4, the shape of the pattern portion PTN (or the plurality of concave portions 311 and the plurality of convex portions 312) may be easily formed without any defect as compared with the case that the pitch of the plurality of convex patterns 143 is greater than that of the plurality of convex portions 312.

Hereinafter, the display apparatus 1 according to one embodiment of the present disclosure will be described in detail with reference to FIGS. 5 to 8E.

Figure 6:
FIG. 6 is a schematic cross-sectional view taken along line III-III' shown in FIG. 5.
Figure 6:
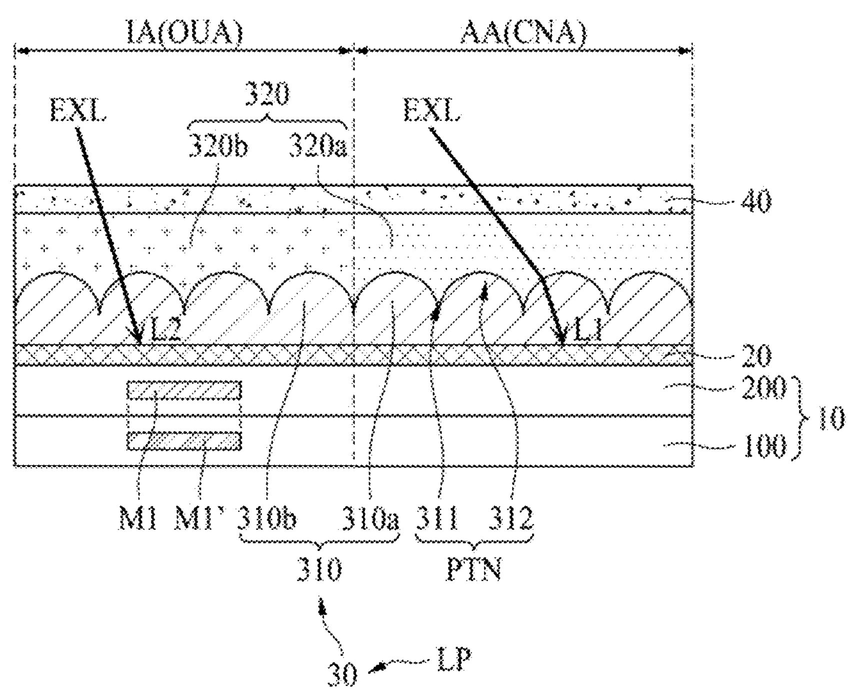
Figure 7A:
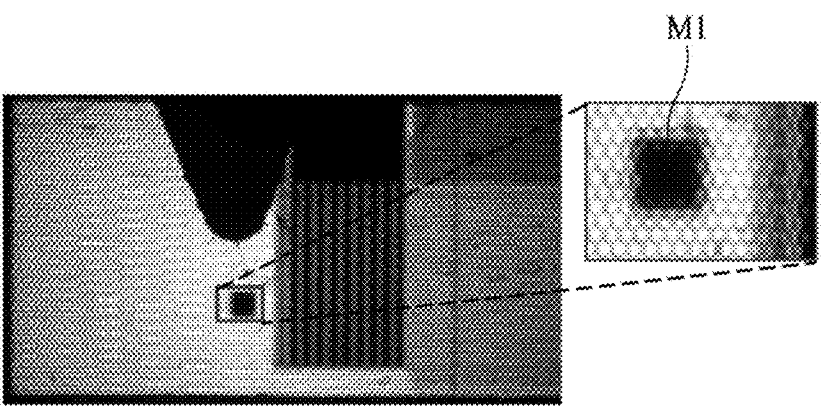
FIG. 7A is a comparative example illustrating a vision image of a display apparatus in which a central area and an outer area have the same refractive index.
Figure 7B:
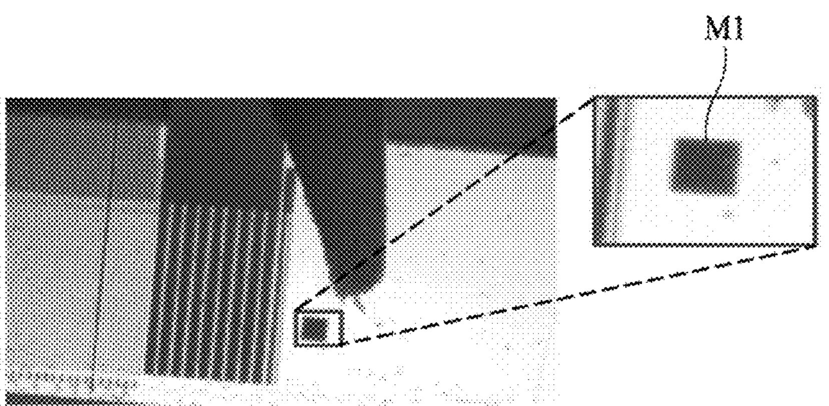
FIG. 7B illustrates a vision image of a display apparatus according to one embodiment of the present disclosure.
Figure 8A:
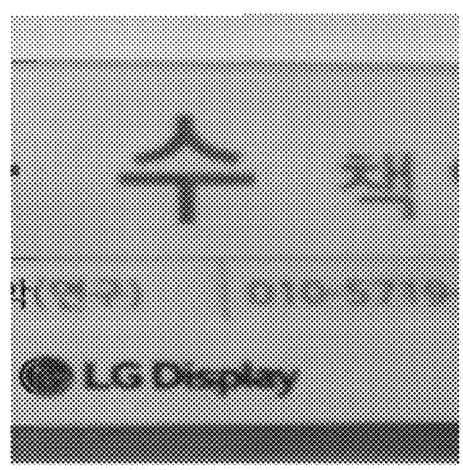
FIGS. 8A, 8B, 8C and 8D illustrate images according to a haze of a display apparatus according to one embodiment of the present disclosure.
Figure 8B:
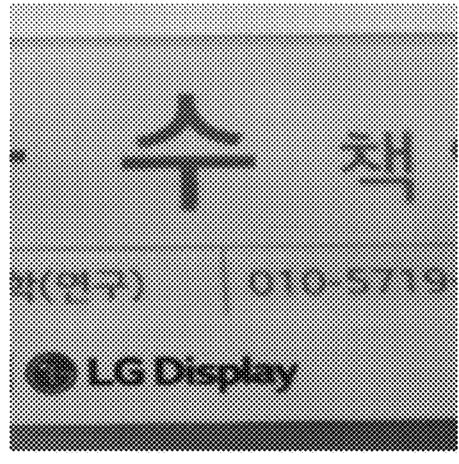
Figure 8C:
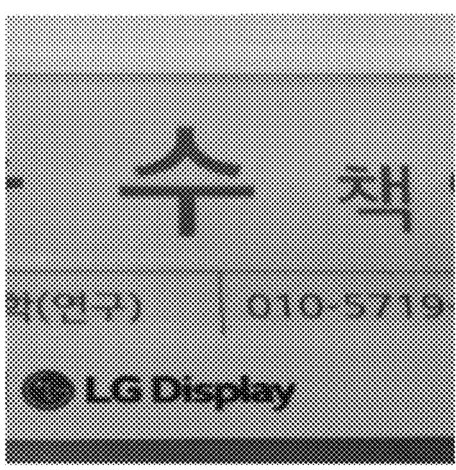
Figure 8D:
Figure 8E:
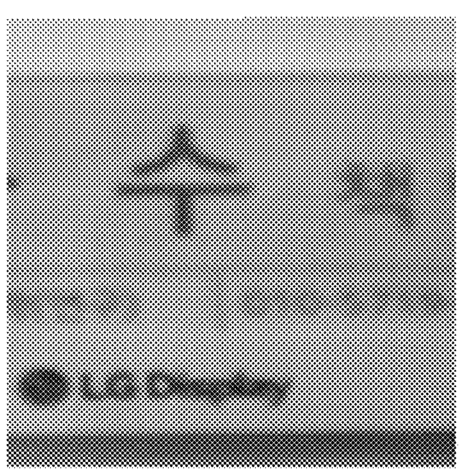
FIG. 8E is a comparative example illustrating an image according to a haze of a display apparatus in which a central area and an outer area have the same refractive index.

FIG. 5 is a schematic plan view illustrating a display apparatus according to one embodiment of the present disclosure, FIG. 6 is a schematic cross-sectional view taken along line III-III' shown in FIG. 5, FIG. 7A is a comparative example illustrating a vision image of a display apparatus in which a central area and an outer area have the same refractive index, FIG. 7B illustrates a vision image of a display apparatus according to one embodiment of the present disclosure, FIGS. 8A to 8D illustrate images according to a haze of a display apparatus according to one embodiment of the present disclosure, and FIG. 8E is a comparative example illustrating an image according to a haze of a display apparatus in which a central area and an outer area have the same refractive index.

The display apparatus 1 according to one embodiment of the present disclosure may be provided in a structure in which the optical member 30 is coupled to the display panel 10 as shown in FIG. 1. In this case, as shown in FIG. 5, the second layer 320 on the display panel 10 may be seen on a plane.

As shown in FIG. 5, in the display apparatus 1 according to one embodiment of the present disclosure, the second layer **320*a* having a great difference in the refractive index from the first layer 310 may be disposed in a partial area of the non-display area IA and the display area AA, and the second layer 320*b* having a small difference in the refractive index from the first layer 310 or having no difference in the refractive index from the first layer 310 may be disposed in the remaining area of the non-display area IA. A partial area of the non-display area IA may be an area in which the peripheral circuit portion 120 is disposed. That is, a partial area of the non-display area IA may be a first non-display area IA1. The remaining area of the non-display area IA may be the non-display area IA having the alignment mark M1 and/or the tab bonding mark M2. That is, the remaining area of the non-display area IA may be a second non-display area IA2. For convenience of description, FIG. 5 illustrates hatching of each of a second layer 320*a* (or a first sub-layer 320*a*) having a great difference in the refractive index from the first layer 310 on the display panel 10 and a second layer 320***b* (or a second sub-layer 320*b*) having a small difference in the refractive index from the first layer 310 or having no difference in the refractive index from the first layer 310. Hereinafter, it will be described based on FIG. 5.

Referring to FIG. 5, in the display apparatus 1 according to one embodiment of the present disclosure, the second layer 320 (or the first sub-layer 320*a*) having a great difference in the refractive index from the first layer 310 may be disposed in the display area AA and the first non-display area IA1 on the display panel 10.

Therefore, the difference in the refractive index between the first layer 310 and the second layer 320 (or the first sub-layer 320*a*), which are disposed to correspond to the first non-display area IA1, may be the same as the difference in the refractive index between the first layer 310 and the second layer 320 (or the first sub-layer 320*a*), which are disposed to correspond to the display area AA. Therefore, in the display apparatus 1 according to one embodiment of the present disclosure, since the first layer 310 and the second layer 320, which has no difference in the refractive index, are disposed in the display area AA and the first non-display area IA1, the sense of difference between the display area AA and the first non-display area IA1 may be minimized.

Meanwhile, the display area AA may be an area corresponding to the central area CNA of the optical member 30 in the thickness direction of the substrate 100. Therefore, a great difference may exist between the refractive index of the second layer 320 (or the first sub-layer 320*a*) and the refractive index of the first layer 310 in the central area CNA. Therefore, as shown in FIG. 6, the external light may be refracted (or diffracted) on an interlayer boundary between the first layer 310 and the second layer 320 of the central area CNA, and the refracted (or diffracted) light may be incident on the display panel 10. As the difference in the refractive index between the second layer 320 (or the first sub-layer 320*a*) and the first layer 310 in the central area CNA becomes greater, the external light may be more refracted by the Snell's law.

In the central area CNA, the refractive index of the first layer 310 may be greater than or smaller than the refractive index of the second layer 320 (or the first sub-layer 320*a*). That is, when the refractive index of the first layer 310 is not equal to the refractive index of the second layer 320 (or the first sub-layer 320*a*) in the central area CNA, the external light may be diffracted and/or scattered so that the intensity of light may be reduced. In addition, as the difference in the refractive index between the first layer 310 and the second layer 320 (or the first sub-layer 320*a*) in the central area CNA becomes greater, the degree of diffraction and/or scattering of the external light may be increased, whereby the intensity of light may be more reduced.

For example, the difference in the refractive index between the second layer 320 (or the first sub-layer 320*a*) and the first layer 310 in the central area CNA may be 0.01 or more. Preferably, the difference in the refractive index between the second layer 320 (or the first sub-layer 320*a*) and the first layer 310 in the central area CNA may exceed 0.03. Therefore, in the display apparatus 1 according to one embodiment of the present disclosure, since the intensity of external light incident on the central area CNA (or the display area AA) may be reduced, the diffraction pattern of the reflective light generated by the light extraction portion 140 may be suppressed or minimized, or occurrence of a radial rainbow pattern and a radial circular ring pattern may be suppressed or minimized due to non-regularity or randomness of the diffraction pattern of the reflective light.

Referring to FIG. 5, in the display apparatus 1 according to one embodiment of the present disclosure, the second layer 320 (or the second sub-layer 320*b*) having a small difference or no difference in the refractive index from the first layer 310 on the display panel 10 may be disposed in the second non-display area IA2. The second non-display area IA2 may be an area corresponding to the outer area OUA of the optical member 30 in the thickness direction of the substrate 100. Therefore, there may be no difference or a small difference in the refractive index between the second layer 320 (or the second sub-layer 320*b*) and the first layer 310 in the outer area OUA. Therefore, the difference in the refractive index between the first layer 310 and the second layer 320 (or the first sub-layer 320*a*), which are disposed to correspond to the first non-display area IA1, may be greater than the difference in the refractive index between the first layer 310 and the second layer 320 (or the second sub-layer 320*b*), which are disposed to correspond to the second non-display area IA2.

For example, the difference in the refractive index between the second layer 320 (or the second sub-layer 320*b*) and the first layer 310 in the outer area OUA may be 0 to 0.03. When the difference in the refractive index between the second layer 320 (or the second sub-layer 320*b*) and the first layer 310 is 0, the refractive index of the second layer 320 (or the second sub-layer 320*b*) and the refractive index of the first layer 310 may be the same as each other. In this case, since the refractive indexes of the first layer 310 and the second layer 320 are the same as each other, as shown in FIG. 6, the external light incident on the first layer 310 or the second layer 320 may be transmitted straight without being refracted on the interlayer boundary. Therefore, since the display apparatus 1 according to one embodiment of the present disclosure may improve the recognition rate of the alignment mark M1 and/or the tab bonding mark M2 disposed in the outer area (or the second non-display area IA2), the alignment defect of the substrate 100 and the opposing substrate 200 may be avoided. However, in this case, the difference in the refractive index between the second layer 320 (or the second sub-layer 320*b*) and the first layer 310 in the outer area OUA may be smaller than the difference in the refractive index between the second layer 320 (or the first sub-layer 320*a*) and the first layer 310 in the central area CNA. That is, the difference in the refractive index between the second layer 320 (or the first sub-layer 320*a*) and the first layer 310 in the central area CNA may be greater than the difference in the refractive index between the second layer 320 (or the second sub-layer 320*b*) and the first layer 310 in the outer area OUA.

When the difference in the refractive index between the second layer 320 (or the first sub-layer 320*a*) and the first layer 310 in the central area CNA is smaller than the difference in the refractive index between the second layer 320 (or the second sub-layer 320*b*) and the first layer 310 in the outer area OUA, the intensity of external light incident on the central area CNA is not reduced, or its decrease rate is too low, whereby the diffraction pattern of the reflective light generated by the light extraction portion 140 may be increased. As a result, the radial rainbow pattern and the radial circular ring pattern may be generated. This may not only deteriorate black visibility during non-driving of the display apparatus but also deteriorate image visibility when the display apparatus is driven. Therefore, in the display apparatus 1 according to one embodiment of the present disclosure, the difference in the refractive index between the second layer 320 (or the first sub-layer 320*a*) and the first layer 310 in the central area CNA may be greater than the difference in the refractive index between the second layer 320 (or the second sub-layer 320*b*) and the first layer 310 in the outer area OUA, so that the intensity of external light may be reduced in the central area CNA, whereby the radial rainbow pattern and the radial circular ring pattern of the reflective light may be suppressed or minimized. As a result, the display apparatus 1 according to one embodiment of the present disclosure may implement real black visibility during non-driving, and may improve image visibility during driving.

Meanwhile, the display apparatus 1 according to one embodiment of the present disclosure may include an alignment mark M1 formed on any one of the substrate 100 and the opposing substrate 200, but is not limited thereto. As shown in FIG. 6, the display apparatus 1 may include an alignment mark M1 formed on the opposing substrate 200 and a sub-alignment mark M1' formed on the substrate 100. In this case, since each of the alignment mark M1 and the sub-alignment mark M1' may be recognized, alignment accuracy of the opposing substrate 200 and the substrate 100 may be maximized.

As shown in FIG. 6, the display apparatus 1 according to one embodiment of the present disclosure may further include a polarizing plate 40 disposed on the optical member 30. The polarizing plate 40 according to one example may be disposed at a position, on which external light is first incident, in the display apparatus 1. Therefore, as shown in FIG. 6, the polarizing plate 40 may be disposed on the second layer 320 of the optical member 30. The polarizing plate 40 is intended to allow a polarizing component in any one direction of incident light to pass therethrough and absorb or reflect the other components. Therefore, when the polarizing plate 40 is provided on the optical member 30, the decrease in the intensity of external light incident on the display panel 10 may be maximized. The optical member 30 and the polarizing plate 40 may be included in the optical panel LP.

Referring to FIGS. 7A and 7B, FIG. 7A shows a vision image of a display apparatus in which a central area and an outer area have the same refractive index. That is, FIG. 7A is a comparative example showing a vision image of the display apparatus having no difference in the refractive index between the central area CNA and the outer area OUA while having a great difference in the refractive index between the first layer 310 and the second layer 320.

In case of the display apparatus of the comparative example according to FIG. 7A, the difference in the refractive indexes between the first layer 310 and the second layer 320 may be great so as to suppress or minimize occurrence of the radial rainbow pattern and the radial circular ring pattern due to the diffraction pattern of reflective light. In the display apparatus of the comparative example of FIG. 7A, since the first layer 310 and the second layer 320, which have a great difference in the refractive index, are equally formed in the central area CNA (or the display area AA) and the outer area OUA (or the non-display area IA), as shown in FIG. 7A, the alignment mark M1 disposed in the non-display area IA may be distorted and thus may not be clearly recognized in the vision device.

On the contrary, in the display apparatus 1 according to one embodiment of the present disclosure, differences in the refractive indexes of the first layer 310 and the second layer 320 may be different from each other in the central area CNA and the outer area OUA. In more detail, in the display apparatus 1 according to one embodiment of the present disclosure, the difference in the refractive index between the first layer 310 and the second layer 320, which are disposed in the central area CNA (or the display area AA) is greater than the difference in the refractive index between the first layer 310 and the second layer 320, which are disposed in the outer area OUA (or the non-display area IA). Therefore, the light may be diffracted or scattered in the central area CNA (or the display area AA) to reduce the intensity of the external light EXL, and the light may not be refracted in the outer area OUA (or the non-display area IA) to clearly recognize the alignment mark M1 as shown in FIG. 7B, whereby assembly may be improved to reduce the defect rate. This structure may be equally applied onto the tab bonding mark M2 of FIG. 5. Therefore, in the display apparatus 1 according to one embodiment of the present disclosure, since the tab bonding mark M2 for bonding the printed circuit board (PCB) to the tab of the substrate 100 may be clearly recognized, assembly may be improved to reduce a pixel driving defect Consequently, in the display apparatus 1 according to one embodiment of the present disclosure, the refractive indexes of the first layer 310 and the second layer 320 in the display area AA are different from each other, and the refractive indexes of the first layer 310 and the second layer 320 in the non-display area IA in which a recognition mark (e.g., alignment mark or a tab bonding mark) for an assembly process is positioned may be the same or similar as each other. The case that the refractive index of the first layer 310 and the refractive index of the second layer 320 are different from each other may mean that the refractive index of the first layer 310 is greater or smaller than the refractive index of the second layer 320.

In the display apparatus 1 according to one embodiment of the present disclosure, the difference in the refractive index between the first layer 310 and the second layer 320 of the optical member 30 provided on the alignment mark M1 and the tab bonding mark M2 is small or does not exist, whereby a defect rate of an alignment process and/or a bonding process may be reduced.

Also, in the display apparatus 1 according to one embodiment of the present disclosure, as the difference in the refractive index between the first layer 310 and the second layer 320 of the optical member 30 provided on the display area AA and the non-display area IA except the area in which the alignment mark M1 and the tab bonding mark M2 are provided may be great, the intensity of external light EXL may be reduced, so that the radial rainbow pattern and the radial circular ring pattern according to the diffraction pattern of the reflective light may be reduced or minimized.

Meanwhile, the display apparatus 1 according to one embodiment of the present disclosure may be manufactured through the following process.

First, after the first layer 310 is coated on a carrier film, the plurality of concave portions and the plurality of convex portions are formed through a photo process and an ashing process.

Then, the second layer 320 (or the first sub-layer 320*a*) having a great difference in a refractive index from the first layer 310 is coated on a first area for reducing the intensity of external light. For example, the first area may be the display area AA.

Next, the second layer 320 (or the second sub-layer 320*b*) having no difference or a small difference in a refractive index from the first layer 310 is coated on a second area having a high mark recognition rate. For example, the second area may be the non-display area IA having the alignment mark M1 and/or the tab bonding mark M2.

Next, the lower surface of the first layer 310 is attached to the upper surface of the opposing substrate 200 of the display panel 10, and the carrier film is removed. As a result, the opposing substrate 200 to which the optical member 30 is attached may be manufactured.

Next, the opposing substrate 200 to which the optical member 30 is attached is aligned on the substrate 100 based on the alignment mark M1, and then the opposing substrate 200 is bonded to the substrate 100. Therefore, the display apparatus 1 according to one embodiment of the present disclosure may be manufactured.

Therefore, the display apparatus 1 according to one embodiment of the present disclosure may reduce the intensity of light in the first area to prevent occurrence of the rainbow pattern and the circular ring pattern due to the reflective light and improve the mark recognition rate in the second area, whereby the defect rate of the alignment process and/or the bonding process may be reduced.

Hereinafter, the display apparatus 1 according to one embodiment of the present disclosure and the display apparatus of the comparative example will be described through comparison in terms of haze with reference to FIGS. 8A to 8E.

FIG. 8A shows an image when the difference in the refractive index between the first layer 310 and the second layer 320 in the non-display area IA (or the outer area OUA) of the display apparatus 1 according to one embodiment of the present disclosure is 0.03 (when the refractive index of the second layer 320 is greater than that of the first layer 310). Supposing that a haze value is 0 when an image is clearly seen, a haze value of the display apparatus 1 according to FIG. 8A may be 19.1%. As shown in FIG. 8A, since the difference in the refractive index between the first layer 310 and the second layer 320 is 0.03, the image may be recognized although slightly blurred.

FIG. 8B shows an image when the difference in the refractive index between the first layer 310 and the second layer 320 in the non-display area IA (or the outer area OUA) of the display apparatus 1 according to one embodiment of the present disclosure is 0.02. Supposing that a haze value is 0 when an image is clearly seen, a haze value of the display apparatus 1 according to FIG. 8B may be 11.8%. As shown in FIG. 8B, since the difference in the refractive index between the first layer 310 and the second layer 320 is 0.02, it is smaller than that in case of the display apparatus of FIG. 8A and thus the image may be seen more clearly than that of FIG. 8A, whereby the recognition rate may be improved.

FIG. 8C shows an image when the difference in the refractive index between the first layer 310 and the second layer 320 in the non-display area IA (or the outer area OUA) of the display apparatus 1 according to one embodiment of the present disclosure is 0.01. Supposing that a haze value is 0 when an image is clearly seen, a haze value of the display apparatus 1 according to FIG. 8C may be 5.2%. As shown in FIG. 8C, since the difference in the refractive index between the first layer 310 and the second layer 320 is 0.01, it is smaller than that in case of the display apparatus of FIG. 8B and thus the image may be seen more clearly than that of FIG. 8B, whereby the recognition rate may be more improved.

FIG. 8D shows an image when the difference in the refractive index between the first layer 310 and the second layer 320 in the non-display area IA (or the outer area OUA) of the display apparatus 1 according to one embodiment of the present disclosure is 0. In this case, a haze value may be 0 to 1%. As shown in FIG. 8D, since the difference in the refractive index between the first layer 310 and the second layer 320 is 0, it is smaller than that in case of the display apparatus of FIG. 8C and thus the image may be seen most clearly.

FIG. 8E shows an image according to a haze of a display apparatus of a comparative example. The display apparatus of the comparative example of FIG. 8E has no difference in a refractive index between the central area CNA and the outer area OUA while having a great difference in the refractive index between the first layer 310 and the second layer 320.

FIG. 8E shows an image when the difference in the refractive index between the first layer 310 and the second layer 320 in the non-display area IA (or the outer area OUA) of the display apparatus of the comparative example is 0.04 (when the refractive index of the second layer 320 is greater than that of the first layer 310). Supposing that a haze value is 0 when an image is clearly seen, a haze value of the display apparatus according to FIG. 8E may be 27.1%. In the display apparatus of FIG. 8E, since the difference in the refractive index between the first layer 310 and the second layer 320 is 0.04, the display apparatus of FIG. 8E has a greater difference in the refractive index than that of the display apparatus of FIG. 8A. Therefore, in case of the display apparatus of FIG. 8E, an image may be seen as being blurred, whereby it may be difficult to recognize the image.

As a result, in the display apparatus 1 according to one embodiment of the present disclosure, a haze of light passing through the first layer 310 and the second layer 320 in the outer area OUA (or the non-display area IA) in which various process marks, for example, the alignment mark M1 and the tab bonding mark M2 are disposed is 20% or less, so that the recognition rate of the alignment mark M1 and/or the tab bonding mark M2 may be improved, whereby assembly may be improved to reduce the defect rate.

Figure 9:
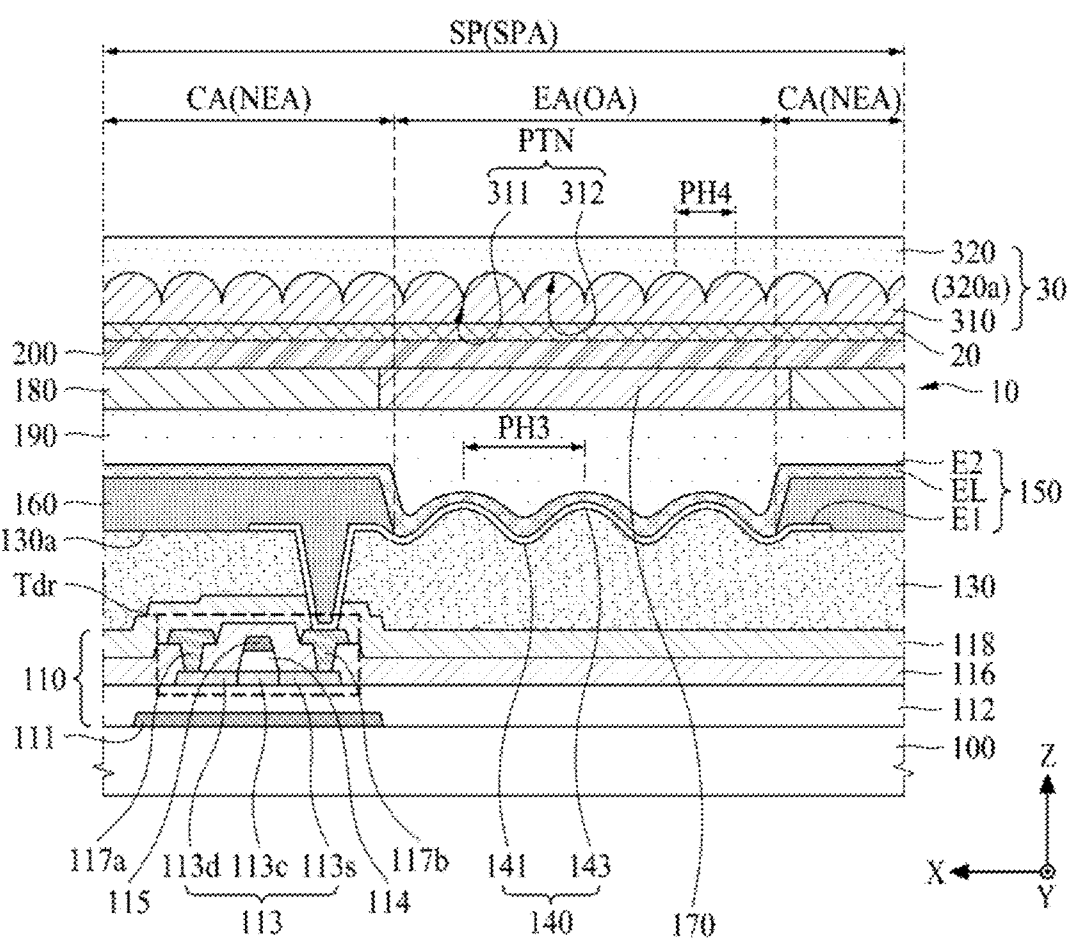
FIG. 9 is a schematic cross-sectional view illustrating a modified example of a display apparatus according to one embodiment of the present disclosure.

FIG. 9 is a schematic cross-sectional view illustrating a modified example of a display apparatus according to one embodiment of the present disclosure.

Referring to FIG. 9, the modification example of the display apparatus 1 according to one embodiment of the present disclosure is the same as the display apparatus of FIG. 4 except that the pitch of the plurality of convex portions 312 included in the optical member 30 and the pitch of the plurality of convex patterns 143 included in the light extraction portion 140 are changed. Therefore, the same reference numerals will be given to the same elements, and only the elements different from those of FIG. 4 will be described below.

In case of the display apparatus according to FIG. 4 described above, the pitch PH2 of the plurality of convex patterns 143 is smaller than the pitch PH1 of the plurality of convex portions 312. Therefore, the number of the light extraction portions 140 (or the plurality of concave patterns 141 and the plurality of convex patterns 143) may be greater than the number of the pattern portions PTN based on the light emission area EA. Therefore, in the display apparatus according to FIG. 4, the pattern portion PTN (or the plurality of concave portions 311 and the plurality of convex portions 312) may be easily formed as compared with the case that the pitch of the plurality of convex patterns 143 is greater than that of the plurality of convex portions 312, whereby the defect of the pattern portion PTN may be reduced.

On the contrary, in case of the display apparatus according to FIG. 9, the pitch PH3 of the plurality of convex patterns 143 may be greater than the pitch PH4 of the plurality of convex portions 312. That is, the pitch of the plurality of concave portions 311 may be smaller than the pitch of the plurality of concave patterns 141. Therefore, in case of the display apparatus 1 according to FIG. 9, since the decrease in the intensity of external light incident on the light extraction portion 140 may be maximized by the optical member 30 (or the external light may be further subdivided), the decrease in the radial rainbow pattern and the radial circular ring pattern according to the diffraction pattern of the reflective light may be maximized.

Figure 10:
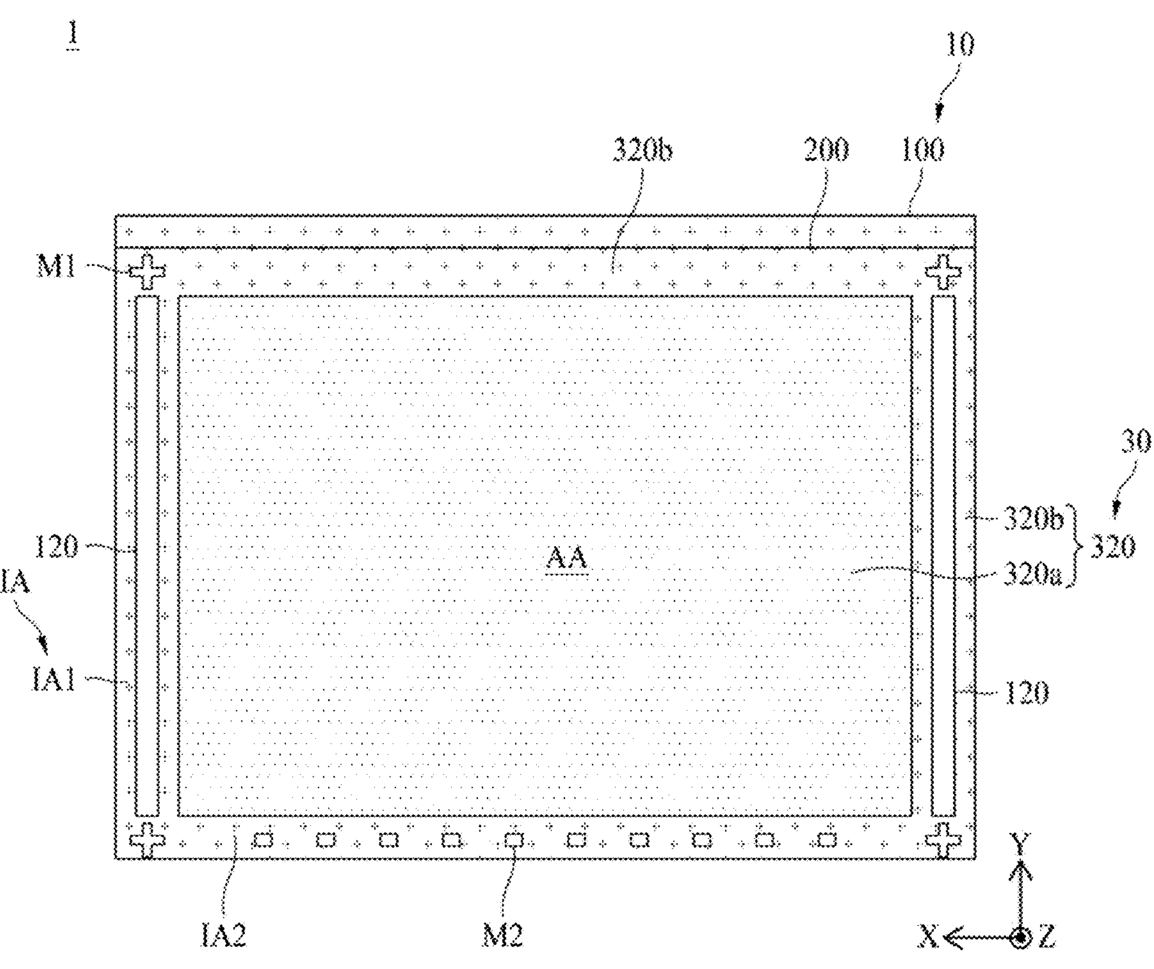
FIG. 10 is a schematic plan view illustrating a display apparatus according to another embodiment of the present disclosure.
Figure 11:
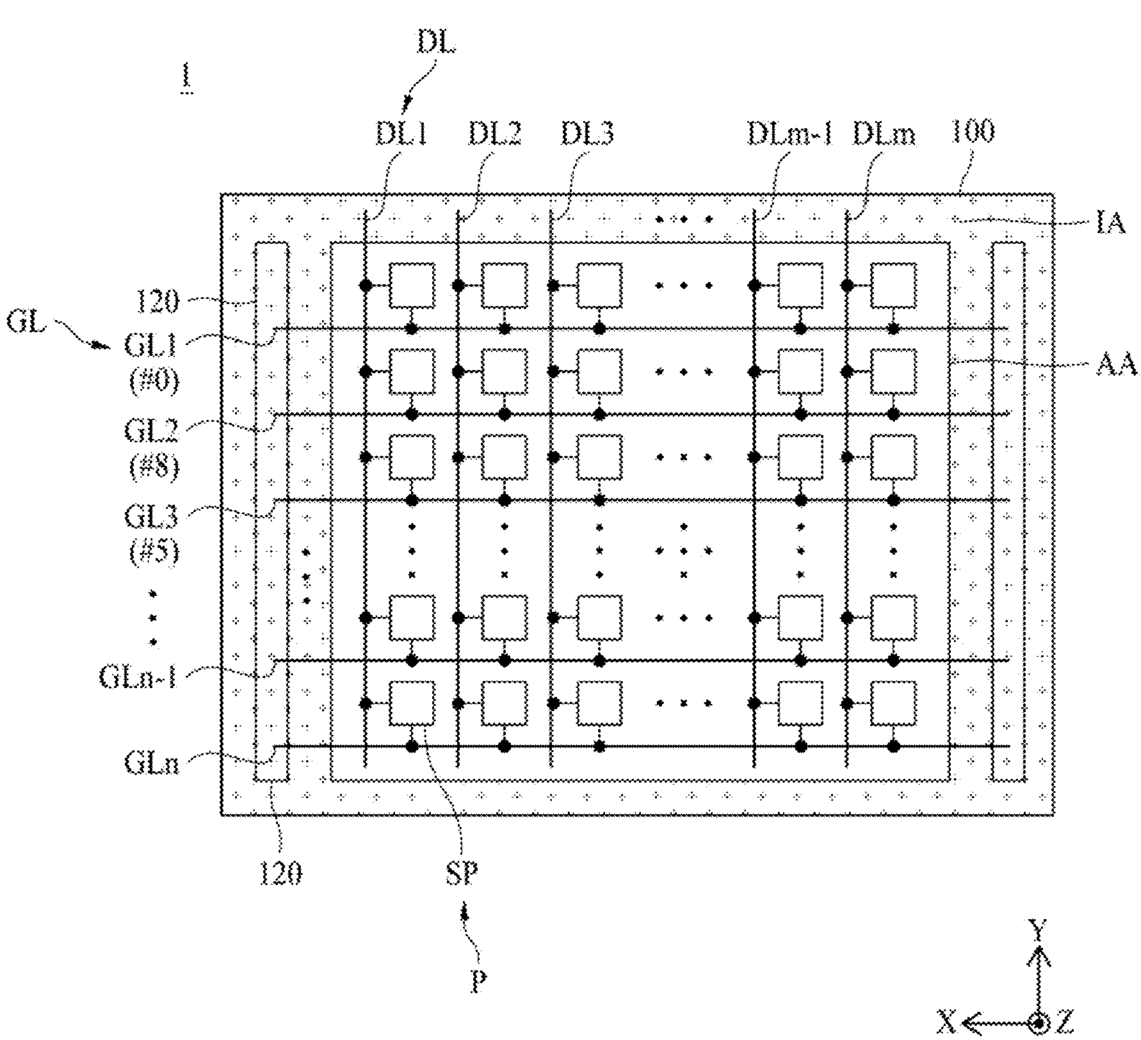
FIG. 11 is a schematic circuit view of FIG. 10.

FIG. 10 is a schematic plan view illustrating a display apparatus according to another embodiment of the present disclosure, and FIG. 11 is a schematic circuit view of FIG. 10.

Referring to FIG. 10, the display apparatus 1 according to another embodiment of the present disclosure is the same as the display apparatus of FIG. 5 except that a formation area of the second layer 320 (or the first sub-layer 320*a*) having a great difference in the refractive index from the first layer 310 is changed. Therefore, the same reference numerals will be given to the same elements, and only the elements different from those of FIG. 5 will be described below.

In case of the display apparatus according to FIG. 5 described above, the second layer 320 (or the first sub-layer 320*a*) having a great difference in the refractive index from the first layer 310 is disposed in the display area AA and the first non-display area IA1. Therefore, the difference in the refractive index between the first layer 310 and the second layer 320 (or the first sub-layer 320*a*), which are disposed to correspond to the first non-display area IA1 may be the same as the difference in the refractive index between the first layer 310 and the second layer 320 (or the first sub-layer 320*a*), which are disposed to correspond to the display area AA. Therefore, in the display apparatus 1 according to one embodiment of the present disclosure, since the difference in the refractive index between the first layer 310 and the second layer 320 is equally applied to the display area AA and the first non-display area IA1, the sense of difference between the display area AA and the first non-display area IA1 may be minimized, and occurrence of the radial rainbow pattern and the radial circular ring pattern may be suppressed or minimized.

On the contrary, in case of the display apparatus according to FIG. 10, the second layer 320 (or the first sub-layer 320*a*) having a great difference in the refractive index from the first layer 310 is disposed only in the display area AA. That is, the second layer 320 (or the second sub-layer 320*b*) having a small or no difference in the refractive index from the first layer 310 is disposed in the first non-display area IA1 and the second non-display area IA2. Therefore, the difference in the refractive index between the first layer 310 and the second layer 320 (or the second sub-layer 320*b*), which are disposed to correspond to the first non-display area IA1, may be the same as the difference in the refractive index between the first layer 310 and the second layer 320 (or the second sub-layer 320*b*), which are disposed to correspond to the second non-display area IA2. Therefore, the difference in the refractive index between the first layer 310 and the second layer 320 (or the second sub-layer 320*b*), which are disposed to correspond to the first non-display area IA1 and the second non-display area IA2, may be smaller than the difference in the refractive index between the first layer 310 and the second layer 320 (or the first sub-layer 320*a*), which are disposed to correspond to the display area AA.

Therefore, in the display apparatus 1 according to another embodiment of the present disclosure, since the first layer 310 and the second layer 320, which have the same refractive index or a small difference in the refractive index, are disposed in the first non-display area IA1 provided with the peripheral circuit portion 120, a recognition rate for the peripheral circuit portion 120 may be improved.

As shown in FIG. 11, a plurality of gate lines GL disposed in the peripheral circuit portion 120 may be connected to each of the plurality of subpixels SP to apply a gate signal for driving each of the plurality of subpixels SP. In addition, a plurality of data lines DL crossing the plurality of gate lines GL may be respectively connected to the plurality of subpixels SP to apply a data signal for driving each of the plurality of subpixels SP. The plurality of gate lines GL may be disposed in the second direction (Y-axis direction) as 'n' number of gate lines GL. For example, an end of each of the first gate line GL1 to the (n)th gate line GLn may be disposed in the peripheral circuit portion 120. The plurality of data lines DL may be disposed in the first direction (X-axis direction) as 'm' number of data lines DL. For example, an end of each of the first data line DL1 to the (m)th data lines DLm may be disposed in the non-display area IA positioned above the display area AA.

As shown in FIG. 11, the plurality of gate lines GL may include their respective recognition marks (e.g., gate line identification numbers). For example, the recognition mark may be engraved on the peripheral circuit portion 120 in which each of the gate lines GL is disposed. As shown in FIG. 11, the ends of the 'n' number of gate lines GL1 to GLn spaced apart from one another in the second direction (Y-axis direction) and disposed in parallel in the first direction (X-axis direction) may be disposed in the peripheral circuit portion 120. For example, the peripheral circuit portion 120 may include a recognition mark (or identification number) of #0 for identifying the first gate line GL1, a recognition mark (or identification number) of #8 for identifying the second gate line GL2, and a recognition mark (or identification number) of #5 for identifying the third gate line GL3.

As described above, in the display apparatus 1 according to another embodiment of the present disclosure, since the first layer 310 and the second layer 320, which have the same refractive index or a small difference in the refractive index, are disposed in the first non-display area IA1 provided with the peripheral circuit portion 120, the identification number of each of the plurality of gate lines GL may be easily recognized. Therefore, the display apparatus 1 according to another embodiment of the present disclosure may identify and specify a gate line connected to a defective subpixel in which a defect has occurred in an inspection process of the display panel 10, and thus a laser repair process for cutting only the gate line connected to the defective subpixel by using laser may be easily performed through defective coordinate inspection information. As a result, the display apparatus 1 according to another embodiment of the present disclosure may improve battery service life by preventing a power source or power from being unnecessarily supplied to the defective subpixel SP through the laser repair process.

Figure 12:
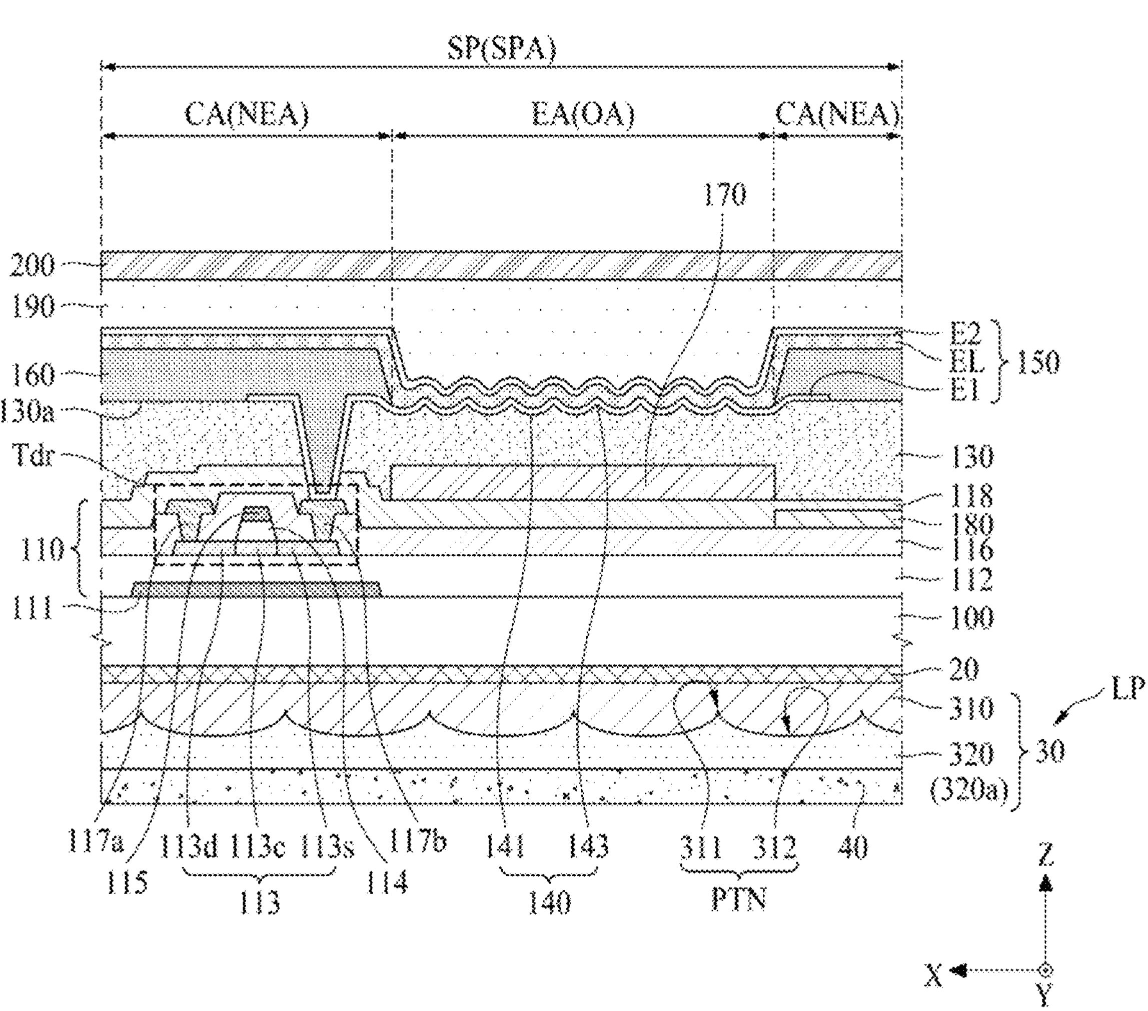
FIG. 12 is a schematic cross-sectional view illustrating a display apparatus according to other embodiment of the present disclosure.

FIG. 12 is a schematic cross-sectional view illustrating a display apparatus according to another embodiment of the present disclosure.

Referring to FIG. 12, the display apparatus 1 according to another embodiment of the present disclosure is the same as the display apparatus of FIG. 4 except that the display panel 10 is changed to a bottom emission type and the optical member 30 (or the optical panel LP) is coupled to the lower side of the display panel 10. Therefore, the same reference numerals will be given to the same elements as those of FIG. 4, and only the elements different from those of FIG. 4 will be described below.

In case of the display apparatus according to FIG. 4 described above, the optical member 30 (or the first layer 310 and the second layer 320) may be coupled onto the upper surface of the display panel 10 so that the intensity of the external light EXL may be reduced by diffracting or scattering light in the central area CNA, and the light may not be refracted in the outer area OUA to improve the recognition rate of the mark or the object, whereby the alignment defect may be reduced.

On the contrary, in case of the display apparatus according to FIG. 12, the display panel 10 is implemented in a bottom emission type. Therefore, the optical member 30 (or the optical panel LP) may be coupled to the direction in which light is emitted from the display panel 10, that is, the lower side of the display panel 10 through the adhesive 20.

Since the display apparatus 1 according to FIG. 12 is a bottom emission type, the color filter layer 170 may be disposed between an overcoat layer 130 and a passivation layer 118. Therefore, the color filter layer 170 may color-convert light emitted from the light emitting element layer 150 and directed toward the lower surface of the substrate 100. In addition, since the display apparatus 1 according to FIG. 12 is a bottom emission type, the black matrix 180 may be disposed between the passivation layer 118 and an interlayer insulating layer 116 without overlapping the color filter layer 170. Therefore, the black matrix 180 may be disposed between adjacent subpixels SP to prevent color mixture from occurring, but is not limited thereto. The black matrix 180 may be disposed on the same layer as the color filter layer 170 as far as it may prevent color mixture from occurring.

Meanwhile, since the display apparatus 1 according to FIG. 12 is a bottom emission type, a second electrode E2 may be provided as a reflective electrode, and a first electrode E1 may be provided as a translucent electrode or a transparent electrode.

In case of the display apparatus according to FIG. 12, since the external light is incident through the lower side of the display panel 10, the stacking order of the optical panel LP may be disposed in the reverse order of the optical panel of the display apparatus according to FIG. 4. As shown in FIG. 12, the first layer 310 of the optical member 30 may be coupled to the lower surface of the substrate 100 through the adhesive 20. The second layer 320 (or the first sub-layer 320*a*) having a refractive index different from that of the first layer 310 may be disposed below the first layer 310, and the polarizing plate 40 may be disposed below the second layer 320.

Therefore, in case of the display apparatus according to FIG. 12, the recognition rate for the alignment mark M1 provided in the non-display area IA of the display panel 10 may be improved due to the optical member 30 (or the optical panel LP) disposed below the display panel 10. Therefore, in the display apparatus 1 according to FIG. 12, since light incident on the lower surface of the display panel 10 is not refracted in the outer area OUA, the recognition rate of the recognition mark (e.g., the alignment mark M1 and/or the tab bonding mark M2) may be improved, so that the alignment defect may be reduced.

Also, in case of the display apparatus according to FIG. 12, the optical member 30 (or the optical panel LP) disposed below the display panel 10 may reduce reflectance of the external light incident on the lower surface of the central area CNA (or the display area AA) and the intensity of the external light. Therefore, the display apparatus 1 according to FIG. 12 may suppress or minimize the diffraction pattern of the reflective light generated from the light extraction portion 140, or may suppress or minimize occurrence of the radial rainbow pattern and the radial circular ring pattern of the reflective light due to non-regularity or randomness of the diffraction pattern of the reflective light.

Also, the display apparatus 1 according to FIG. 12 may suppress or minimize occurrence of the radial rainbow pattern and the radial circular ring pattern due to the external light due to the optical member 30 (or the optical panel LP) coupled to the lower side of the display panel 10, thereby implementing real black visibility in a non-driving or off state.

According to the present disclosure, the following advantageous effects may be obtained.

In the optical member according to the present disclosure, as differences in the refractive indexes of the first layer and the second layer are different from each other in the central area and the outer area, reflectance of the external light in the central area may be reduced, and the vision recognition rate of the mark used for various alignments in the outer area may be improved.

The display apparatus according to the present disclosure includes the optical member having an improved vision recognition rate in the outer area, so that the alignment defect of the lower substrate and the upper substrate may be reduced.

The optical member according to the present disclosure may include the first layer including the pattern portion having the plurality of concave portions and the plurality of convex portions, and a second layer having a refractive index different from that of the first layer, so that the intensity of the external light passing through the first layer and the second layer may be reduced, whereby reflectance of the external light may be reduced.

In the display apparatus according to the present disclosure, each of the plurality of subpixels may include the light extraction portion that includes a plurality of concave patterns and a plurality of convex patterns, so that light extraction efficiency of the light emitted from the light emitting element layer may be improved.

The display apparatus according to the present disclosure may improve light extraction efficiency through the light extraction portion, and thus may have the same light emission efficiency as that of the display apparatus having no light extraction portion even with a low power, or may have more improved light emission efficiency than that of the display apparatus having no light extraction portion, whereby overall power consumption may be reduced.

The display apparatus according to the present disclosure may be provided with the optical member so that the intensity of the external light incident on the light extraction portion may be reduced by the optical member, whereby the diffraction pattern of the reflective light generated by the light extraction portion may be suppressed or minimized, or occurrence of the radial rainbow pattern and the radial circular ring pattern may be suppressed or minimized due to non-regularity or randomness of the diffraction pattern of the reflective light.

Also, in the display apparatus according to the present disclosure, since the external light may be subdivided by the optical member, occurrence of the radial rainbow pattern and the radial circular ring pattern due to the external light may be suppressed or minimized, whereby real black visibility in a non-driving or off state may be implemented.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present is intended that all variations or modifications derived from the meaning, scope and equivalent concept described in the disclosure fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An optical member comprising:
- a first layer including a pattern portion having a plurality of concave portions and a plurality of convex portions between the plurality of concave portions; and
- a second layer covering the pattern portion,
- wherein the second layer includes a central area and an outer area,
- wherein a refractive index of the second layer in the central area is different from that of the second layer in the outer area,
- wherein the outer area is disposed along a periphery of the optical member, and the central area is disposed inside the outer area as a continuous region, and
- wherein the central area includes a display area for displaying an image.

2. The optical member of claim 1, wherein the refractive index of the second layer in the central area is different from that of the first layer.

3. The optical member of claim 2, wherein the difference in the refractive index between the second layer and the first layer in the central area is 0.01 or more.

4. The optical member of claim 2, wherein the difference in the refractive index between the second layer and the first layer in the central area is 0.03 or more.

5. The optical member of claim 1, wherein the first layer is disposed below the second layer to correspond to each of the central area and the outer area.

6. The optical member of claim 5, wherein a refractive index of the first layer is identical in the central area and the outer area.

7. The optical member of claim 5, wherein the difference in the refractive index between the second layer and the first layer in the outer area is 0 to 0.03.

8. The optical member of claim 5, wherein the difference in the refractive index between the first layer and the second layer, which are disposed in the central area, is greater than the difference in the refractive index between the first layer and the second layer, which are disposed in the outer area.

9. The optical member of claim 5, wherein light passing through the first layer and the second layer in the outer area has a haze of 20% or less.

10. The optical member of claim 1, wherein at least one of an upper surface of the first layer and a lower surface of the second layer is flat.

11. A display apparatus comprising:
- a display panel including a display area for displaying an image; and
- an optical panel coupled to the display panel,
- wherein the optical panel includes an optical member having:
  - a first layer including a pattern portion having a plurality of concave portions and a plurality of convex portions between the plurality of concave portions; and
  - a second layer covering the pattern portion,
  - wherein the second layer includes a central area and an outer area,
- wherein a refractive index of the second layer in the central area is different from that of the second layer in the outer area,
- wherein the outer area is disposed along a periphery of the optical member, and the central area is disposed inside the outer area as a continuous region, and
- wherein the central area includes the display area.

12. The display apparatus of claim 11, wherein the optical panel is coupled to one side of the display panel from which light is emitted.

13. The display apparatus of claim 11, wherein the display panel includes:
- a substrate including a display area having a plurality of subpixels and a non-display area adjacent to the display area; and
- a light extraction portion disposed on the substrate in each of the plurality of subpixels, and wherein the light extraction portion overlaps the pattern portion of the optical member.

14. The display apparatus of claim 13, wherein the display area is disposed to correspond to the central area of the optical member, and
- at least a portion of the non-display area is disposed to correspond to the outer area of the optical member.

15. The display apparatus of claim 14, wherein the non-display area includes a first non-display area having a peripheral circuit portion connected to the plurality of subpixels and a second non-display area having a visual recognition mark, and
- wherein the second non-display area is disposed to correspond to the outer area of the optical member.

16. The display apparatus of claim 15, wherein the first non-display area is disposed to correspond to the central area of the optical member.

17. The display apparatus of claim 15, wherein the first non-display area is disposed to correspond to the outer area of the optical member.

18. The display apparatus of claim 15, wherein the visual recognition mark in the second non-display area includes a tab bonding mark for bonding a printed circuit board to the substrate.

19. The display apparatus of claim 15, wherein the display panel further includes:
- a light emitting element layer on the light extraction portion;
- an opposing substrate on the light emitting element layer to face the substrate; and
- a color filter layer for color-converting light emitted from the light emitting element layer,
- wherein the color filter layer is between the light emitting element layer and the optical member.

20. The display apparatus of claim 19, wherein the visual recognition mark in the second non-display area includes an alignment mark for aligning the substrate and the opposing substrate.

21. The display apparatus of claim 13, wherein the light extraction portion includes a plurality of concave patterns and a plurality of convex patterns between the concave patterns, and wherein a pitch of the plurality of convex patterns is smaller than a pitch of the plurality of convex portions.

22. The display apparatus of claim 13, wherein the light extraction portion includes a plurality of concave patterns and a plurality of convex patterns between the concave patterns, and wherein a pitch of the plurality of convex patterns is greater than a pitch of the plurality of convex portions.

* * * * *